US008284200B2

(12) United States Patent
Kincaid

(10) Patent No.: US 8,284,200 B2
(45) Date of Patent: Oct. 9, 2012

(54) SYSTEMS AND METHODS FOR FOCUS PLUS CONTEXT VIEWING OF DENSE, ORDERED LINE GRAPHS

(75) Inventor: Robert H. Kincaid, Half Moon Bay, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 801 days.

(21) Appl. No.: 12/362,370

(22) Filed: Jan. 29, 2009

(65) Prior Publication Data

US 2010/0188406 A1    Jul. 29, 2010

(51) Int. Cl.
*G06T 11/20*  (2006.01)
*G01R 13/02*  (2006.01)
*G01R 13/00*  (2006.01)

(52) U.S. Cl. ............... 345/440; 702/67; 702/69
(58) Field of Classification Search ............... 345/440.1, 345/660; 702/68, 67, 69; 324/121 R
See application file for complete search history.

(56) References Cited

U.S. PATENT DOCUMENTS

| | | | | | |
|---|---|---|---|---|---|
| 4,801,873 | A | * | 1/1989 | Takano | 324/76.12 |
| 5,004,975 | A | * | 4/1991 | Jordan | 324/121 R |
| 5,039,937 | A | * | 8/1991 | Mandt et al. | 324/121 R |
| 5,129,722 | A | * | 7/1992 | Mader et al. | 356/73.1 |
| 5,321,420 | A | * | 6/1994 | Rezek et al. | 345/440.1 |
| 5,434,954 | A | * | 7/1995 | Kawauchi et al. | 345/440 |
| 5,491,781 | A | * | 2/1996 | Gasperina | 715/786 |
| 5,517,105 | A | * | 5/1996 | Holzwarth | 324/121 R |
| 5,579,463 | A | * | 11/1996 | Takano et al. | 345/440 |
| 5,631,667 | A | * | 5/1997 | Cadwell | 345/440.1 |
| 5,939,877 | A | * | 8/1999 | Alexander | 324/121 R |
| 6,064,401 | A | * | 5/2000 | Holzman et al. | 345/440 |
| 6,642,936 | B1 | * | 11/2003 | Engholm et al. | 345/661 |
| 6,768,497 | B2 | | 7/2004 | Baar et al. | |
| 6,774,890 | B2 | * | 8/2004 | Engholm | 345/173 |
| 6,917,889 | B2 | * | 7/2005 | Ward et al. | 702/67 |
| 7,013,430 | B2 | * | 3/2006 | Jaffe | 715/771 |
| 7,227,549 | B2 | * | 6/2007 | Beasley et al. | 345/440.1 |
| 7,256,801 | B2 | | 8/2007 | Baar et al. | |
| 7,443,396 | B2 | * | 10/2008 | Ilic | 345/440.1 |
| 7,456,626 | B2 | * | 11/2008 | Ishihara et al. | 324/76.19 |
| 7,920,990 | B2 | * | 4/2011 | Nicholls et al. | 702/190 |

(Continued)

OTHER PUBLICATIONS

Tominski et al., Fisheye Tree Views and Lenses for Graph Visualization, Jul. 2006, IEEE Information Visualization, 2006, pp. 17-24.*

(Continued)

*Primary Examiner* — M Good Johnson

(57) ABSTRACT

Systems, methods and computer readable storage media for displaying a dense graph and details of a portion of the dense graph on a display are provided. A processor coupled to memory, an input device and a display are provided to perform operations including: locally distorting a portion of the dense graph identified by interaction through the input device, wherein the local distortion includes expanding the portion of the dense graph along a first dimension axis of the graph, compressing at least one adjacent portion of the dense graph adjacent the expanded portion, and maintaining a scale of all of the dense graph in a second dimension orthogonal to the first dimension. The dense graph and expanded and compressed portions are displayed on the display, wherein all of the graph represented by the display signal on the display prior to performing the local distortion operation is displayed after performing the local distortion operation. In at least one embodiment, the system comprises an oscilloscope.

21 Claims, 27 Drawing Sheets
(21 of 27 Drawing Sheet(s) Filed in Color)

U.S. PATENT DOCUMENTS

| | | | |
|---|---|---|---|
| 7,965,764 B2 * | 6/2011 | Gamper et al. | 375/228 |
| 8,006,195 B1 * | 8/2011 | Woodings et al. | 715/777 |
| 8,106,927 B2 * | 1/2012 | Shoemaker et al. | 345/665 |
| 2005/0041046 A1 | 2/2005 | Baar et al. | |

OTHER PUBLICATIONS

Carpendale, A Framework for Unifying Presentation Space, in Proceedings of the 14th annual ACM symposium on User Interface SW and technology. Orlando, Florida: ACM, 2001, pp. 61-70.

Chen, et al. Computer Program for Calculating the Melting Temperature of Degenerate Oligonucleotides Used in PCR or Hybridization, vol. 22, No. 6, 1997, pp. 1158-1160.

Keahey, The Generalized Detail-In-Context Problem, in Proceedings of the 1998 IEEE Symposium on Inf. Visualization North Carolina IEEE Computer Society, 1998, pp. 44-51.

Leung, A Review and Taxonomy of Distortion-Oriented Presentation Techniques. ACM Trans. Comput-Hum. Interact., vol. 1, Jun. 1994, pp. 126-160.

Lamping et al., A Focus+Context Technique Based on Hyperbolic Geometry for Visualizing Large Hierarchies, in Proceedings of the SIGCHI conf. on Human factors in computing sys. Denver, Colorado, US: ACM Press/Addison-Wesley Publishing Co., 1995 pp. 1-8.

Mackinlay, et al. The Perspective wall: detail and Context Smoothly Integrated, in Proceedings of the SIGCHI conference on Human factors in computing systems: reachin through technology. new Orleans, Louisiana, US: ACM, 1991, pp. 173-179.

Sarkar et al., Graphical Fisheye Views of Graphs, in Proceedings of the SIGCHI conference on Human factors in computing systems. Monterey, CA US: ACM, May 1992, pp. 83-91.

Spence, et al., Data base navigation: an office environment for the professional. in Readings in information visualization: using vision to think Morgan Kaufmann Publishers Inc., 1999, pp. 333-340.

Carpendale, A Framework for Elastic Presentation Space, Simon Fraser University, 1999, pp. 1-300. http://pages.cpsc.ucalgary.ca/sheelagh/wiki/pmwiki.php?n=Main.Thesis.

Furnas et al., Generalized fisheye views, SIGCHI Bull., vol. 17, pp. 16-23, 1986.

* cited by examiner

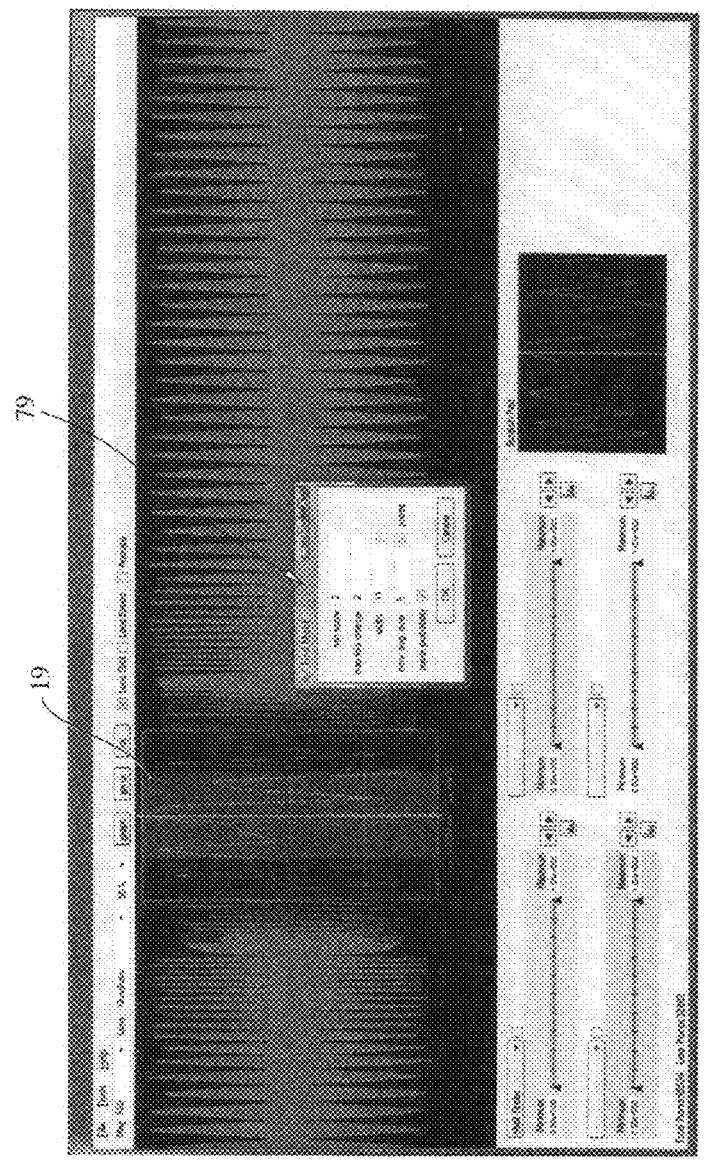

SYSTEMS AND METHODS FOR FOCUS PLUS CONTEXT VIEWING OF DENSE, ORDERED LINE GRAPHS

BACKGROUND OF THE INVENTION

A typical solution for the viewing of data contained in dense line graphs is to use a so-called "pan-and-zoom" interface. This technique is often used in interactive computer maps. Using this technique, the user can progressively zoom into a region of interest to view detail. One drawback to this technique is that the user quickly loses the global context of the entire data set as the region of interest is progressively zoomed. The user then has to zoom back out to again see the context, in order to choose a new region of interest to be zoomed.

An alternative technique is referred to as an "overview plus detail" interface. This technique provides a fixed overview of the entire dataset. The overview is used for selecting regions of interest. When a user selects a region of interest on the fixed overview, this causes a separate additional display to be created or updated in order to show the magnified details of the region of interest selected. Although this technique avoids data occlusion and distortions of the data, the user often has a difficult time cognitively maintaining the relationship between the separate displays. Also, this technique requires additional screen real estate to provide a space to display the additional views. As datasets become more dense in the number of data values, display screen real estate becomes more and more valuable, with less additional space available for such an additional view. This is particularly true in the case of oscilloscopes.

Oscilloscopes are being designed with increasingly larger data storage capacities. For example, it is currently possible, using the AGILENT INFINIUM 90000A (Agilent Technologies, Inc., Santa Clara, Calif.) series oscilloscope, to capture an oscilloscope trace consisting of 1 giga-points of data (i.e., $1\times10^9$ measurements). When very large amounts of data such as this are captured, this presents a problem in displaying the data on the relative modest screen sizes of the typical oscilloscope displays, as the data must be displayed very densely to fit it on the display, making it impossible to discern by the eye of the human user. When data capture amounts become very large, such as in the 1 giga-points example noted above, it is not even practical to provide a much larger display than that used by the typical oscilloscope, as this would still not provide the capability to display a view of the entire trace in full detail that would be readily discernible to the eye of the user.

Accordingly, there is a continuing need for improved systems, methods and techniques for displaying dense, time series graphs on a display in a way that a least a portion of the graph is displayed so that details of the portion can be readily discerned by a human user. This need applies not only to the oscilloscope field, but to other fields in which dense, time series graphs are produced, e.g., mass spectra, chromatograms, etc.

SUMMARY OF THE INVENTION

The present invention provides systems, methods and computer readable media for displaying a dense graph and details of a portion of the dense graph on a display of the system.

In at least one embodiment, the system includes: a processor coupled to memory, an input device and the display, adapted to perform operations including: locally distorting a portion of the dense graph identified by interaction through the input device, the locally distorting comprising expanding the portion of the dense graph along a first dimension axis of the graph, compressing at least one adjacent portion of the dense graph adjacent the expanded portion, and maintaining a scale of all of the dense graph in a second dimension orthogonal to the first dimension; and causing the display to display the dense graph and the expanded and compressed portions, wherein all data represented by the dense graph displayed on the display prior to the locally distorting is displayed after the locally distorting.

In at least one embodiment, the system comprises an oscilloscope.

In at least one embodiment, the operations additionally comprise motif matching additional portions of the dense graph matching at least a selected portion of the expanded portion, wherein the motif matching comprises comparing a portion of the dense graph with a remainder of the dense graph to identify wave forms similar to a wave form formed by the portion.

In at least one embodiment, the operations additionally comprise calculating measurements relative to the dense graph and displaying track marks adjacent the display of the dense graph along the first dimension axis at locations of the graph from which the measurements were calculated where the data at the locations of the graph meet a predefined condition.

In at least one embodiment, at least two different types of measurements are calculated and a track of the track marks is displayed for each type of measurement, respectively.

In at least one embodiment, the processor is further adapted for carrying out logical operations on data identified by the track marks.

In at least one embodiment, the processor is further adapted for calculating measurements of the measurements.

In at least one embodiment, the operations additionally comprise displaying a histogram of the measurements, filtering the tracks in response to a selection of a value in the histogram, and displaying only tracks corresponding to the selected value of the histogram.

In at least one embodiment, the system is further adapted to display at least a portion of the expanded portion on a scratch pad display.

In at least one embodiment, the processor is adapted to cause the display to overlay multiple portions of the graph on the scratch pad display.

In at least one embodiment, the system comprises an oscilloscope and the dense graph comprises an oscilloscope trace, the processor configured to calculate measurements relative to the oscilloscope trace, and the system configured to display track marks adjacent the display of the oscilloscope trace on the display, along the first axis of the oscilloscope trace, adjacent locations of the oscilloscope trace where data used to calculate the measurements meet a predefined condition.

In at least one embodiment, the processor is further adapted to carry out calculations for motif matching additional portions of the oscilloscope trace that are similar to at least a selected portion of the expanded portion, and for causing the display to display the track marks adjacent the additional portions, wherein the motif matching comprises comparing a portion of the dense graph with a remainder of the dense graph to identify wave forms similar to a wave form formed by the portion.

A computer-assisted method of analyzing a dense graph is provided, wherein the method includes: selecting a portion of the dense graph via an input device; wherein, upon receiving the selection via the input device, the computer locally distorts the portion of the dense graph, expanding the portion of the dense graph along a first dimension axis of the graph, compressing at least one adjacent portion of the dense graph adjacent the expanded portion, and maintaining a scale of all of the dense graph in a second dimension orthogonal to the first dimension; and displaying the dense graph and the expanded and compressed portions, wherein all data represented by the dense graph displayed on the display prior to the locally distorting is displayed after the locally distorting.

In at least one embodiment, the method further includes: real time navigating to select a second portion of the dense graph, using the input device;

wherein, upon receiving the selection of the second portion via the input device, the computer locally distorts the second portion of the dense graph, expanding the portion of the dense graph along a time dimension axis of the graph, compressing at least one adjacent portion of the dense graph adjacent the expanded portion, wherein the first portion is returned to an undistorted state, and the scale of all of the dense graph in the second dimension is maintained undistorted; and displaying the dense graph and the expanded second portion and adjacent compressed portions, wherein all data represented by the dense graph displayed on the display prior to the locally distorting is displayed after the locally distorting.

In at least one embodiment, the method includes motif matching the dense graph, wherein the motif matching comprises comparing a portion of the dense graph with a remainder of the time series graph to identify wave forms similar to a wave form formed by the portion; and displaying track marks adjacent the display of the dense graph along the first dimension axis adjacent locations of the graph where wave forms similar to the wave form formed by the portion were identified.

In at least one embodiment, the method includes user selection of the portion, using an input device of a computer configured to carry out the computer-assisted method.

In at least one embodiment, the method includes calculating different types of measurements relative to the dense graph; and displaying track marks adjacent the display of the dense graph, along the first dimension axis of the dense graph, adjacent locations of the dense graph where data is located which, when used in calculating the measurements, meet a predefined criterion, wherein one of the tracks is displayed for each type of measurement, respectively, to enable comparison of the tracks to identify locations along the first axis where disparities occur.

A computer readable storage medium having stored thereon one or more sequences of instructions for facilitating computer-assisted analysis of a dense graph is provided, wherein execution of the one or more sequences of instructions by one or more processors causes the one or more processors to perform a process comprising: providing an interactive user feature for user selection of a portion of the dense graph via an input device; upon receiving user selection of the portion, locally distorting the portion of the dense graph, expanding the portion of the dense graph along a first dimension axis of the graph, compressing at least one adjacent portion of the dense graph adjacent to the expanded portion, and maintaining a scale of all of the dense graph in a second dimension orthogonal to the first dimension; and generating a display signal representing the dense graph and the expanded and compressed portions, wherein all of the graph represented by the display signal prior to the locally distorting is represented by the display signal after the locally distorting.

In at least one embodiment, the process additionally comprises: motif matching the remainder of the dense graph not included in the selection portion, wherein the motif matching comprises comparing at least part of the selected portion of the dense graph with the remainder of the graph to identify wave forms similar to a wave form formed by the at least part of the portion.

In at least one embodiment, the process additionally comprises: displaying track marks adjacent the display of the dense graph along the first dimension axis thereof adjacent locations of the graph where motif matches were identified.

These and other features of the invention will become apparent to those persons skilled in the art upon reading the details of the systems, methods and computer readable media as more fully described below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 15 illustrates a marked or highlighted region indicating a width of a signal to be used for motif finding.

DETAILED DESCRIPTION OF THE INVENTION

Figure 1:
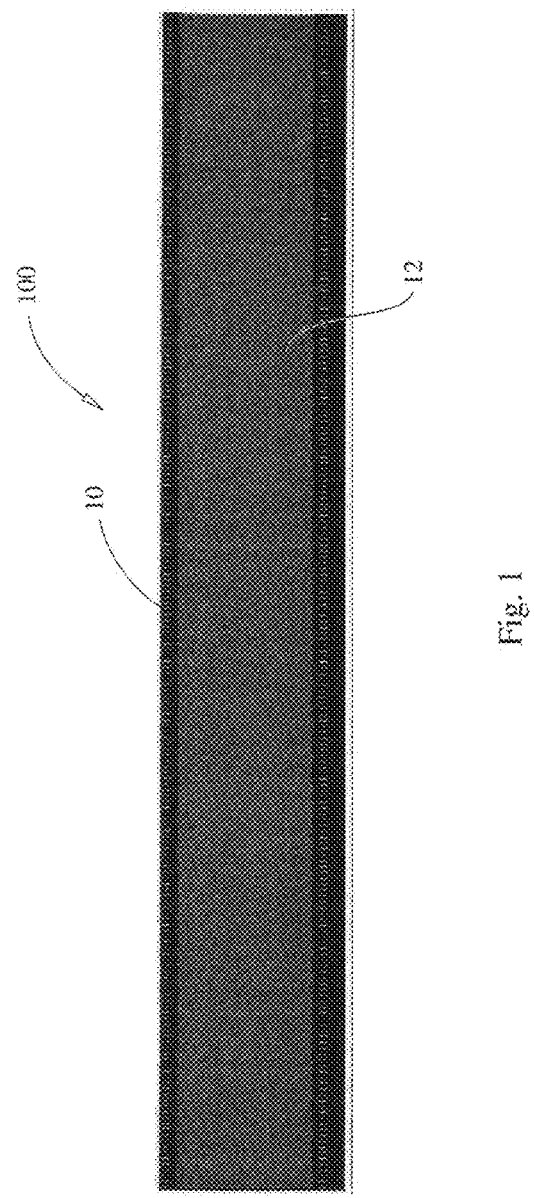
FIG. 1 shows a dense, time series graph displayed on a display of a system according to the present invention.

Before the present systems and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a wave form" includes a plurality of such wave forms and reference to "the slope" includes reference to one or more slopes and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The terms "dense graph" and "dense electronic signal" or "trace", as used herein, refers to a graph which, when displayed on a computer display has too many data points to be displayed in full resolution, based upon the screen resolution of the display that the graph is being displayed on. A "dense, time series graph" is a subset of a "dense graph" or "dense electronic signal". As an example as to the meaning of dense, an example where a time series graph includes 10,000 data points (one data measurement made for each of 10,000 different instances in time), and a display on which the time series graph is displayed has a screen resolution of 1024×768, clearly all of the data points cannot be displayed so that each data point can be visually identified as being distinct from data points immediately adjacent the same. Of course, the density (and decrease in resolution) increases with an increasing number of data points.

For a line resolution of 1024 pixels, dense refers to a graph having more than 1024 data points in that dimension, typically substantially more, such as at least 2,000 data points, in some instances, at least 5,000 data points, in other instances, at least 10,000 data points, in still other instances, at least 20,000 data points, or more.

The term "open" or "opened", when used in the context of the ability of the present invention to show a portion of a time series graph in greater temporal detail, refers to magnifying or expanding the time axis, so that the data points of the time series graph are spaced apart on the time axis further than previously, thereby allowing the display to resolve the signal details of the time series graph and thus allowing the user to see the details.

The term "motif" refers to a specific recurring signal pattern or wave form. As used herein, a motif describes a specific time series graph segment or frequency series graph segment that represents a pattern of interest and which may be represented in more than one location along the time series graph. Such a segment may have a characteristic shape that represents a specific fluctuation in a graph for which it is sought to identify similar fluctuations in other segments of the graph. Searching for such a motif may be performed over the entire extent of the time series graph, or alternatively, over a predefined portion or portions of the graph. Alternatively, a motif may be predetermined and used to search the entire time series graph (or a predefined portion or portions of the graph) for its presence.

Systems, Methods and Computer Readable Storage Media

Referring now to FIG. 1, a dense, time series graph 12 is shown being displayed on display 10 of system 100. Although FIG. 1 and additional figs. and description below refer to use of the present invention with oscilloscope traces, it is noted here that the present invention is not limited to use with oscilloscope traces, but is applicable to other types of dense, time series graphs, such as those noted above, as well as any other dense, time series graphs, including, but not limited to dense, time series graphs analyzed by logic analyzers, radio wave traces, television signals, etc., as well as some types of non-temporal graphs, including, but not limited to frequency domain data generated by spectrum analyzers.

FIG. 1 displays 16,777,214 time points of a modulated signal. The X-axis represents times at which the data values were measured and the Y axis represents the voltage measurements. Thus, the X-axis of the time series graph displays the acquisition times of the signal being measure and the Y-axis of the graph 12 displays the voltages levels of the signal measured. As noted previously, a dense amount of data such as this renders the display of the trace 12 unreadable by the human eye in full detail because the trace 12 is undisplayable by the display, since the data contains more data points in at least one dimension than the display is capable of displaying. In the example of FIG. 1, the waveform has been compacted along the time axis to the extent that details thereof are not displayable. In this compact display form, the human eye cannot distinguish details of the graph. Accordingly, in order to visually analyze the graph 12 for details, a user can open up a portion of the graph 12 to show that portion in a magnified (in the time dimension) view of that portion that allows the user to easily inspect and analyze the data points in that portion, as described in more detail below. The opened view of the portion of the graph 12 takes up more space on the display 10 than the closed (dense) original view of the same portion. To compensate for this while allowing the entire time series graph to continue to be displayed on the display 10, at least one portion adjacent the open portion is compressed along the time axis.

Figure 2:
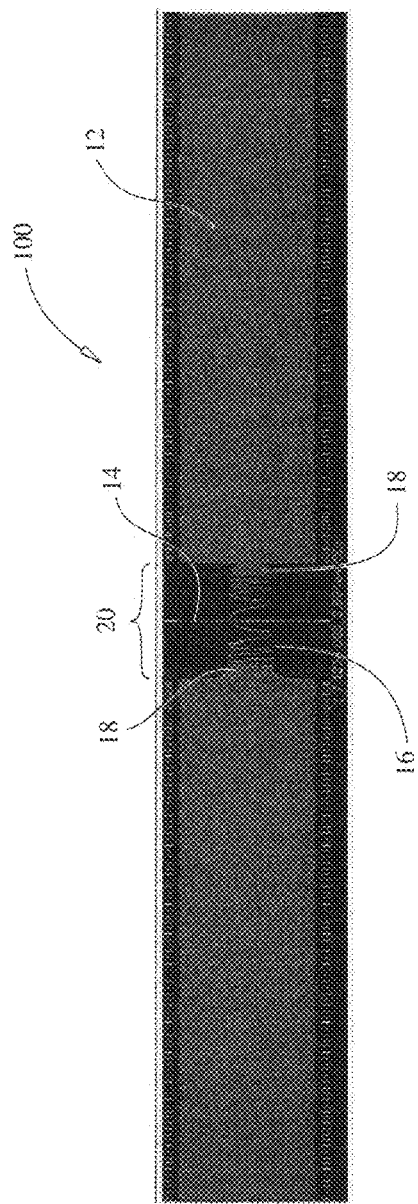
FIG. 2 shows an example where a user has selected a location (time value) along the time axis (X-axis) to provide a detailed display of a portion of the graph for visual inspection thereof.

FIG. 2 shows an example where a user has selected a location 14 (time value) along the time axis (X-axis) to provide a detailed display of a portion 16 of the graph 12 for visual inspection thereof. As noted above, one or both portions 18 adjacent the opened portion 16 are compressed along the time axis in order to allow the additional space on the display 10 to display the opened portion 16, while at the same time allowing display 10 to display all of the time series graph 12 that was shown in the original view (i.e., the view of FIG. 1). An analogy for the function of "opening" can be considered as when one opens a curtain, where the opening is the window that has been exposed by opening, and wherein the curtain folds up or compresses adjacent to where the opening has been formed. Another analogy is the use of a cylindrical magnifying glass on the portion to be magnified to show the details of that portion. In FIG. 2, the open portion 16 has been magnified by a factor of 50,000× in the x-direction. Accordingly, the present invention provides the ability not only to magnify a selected portion of a dense graph, but also the ability to provide extreme magnification of a portion of a dense graph, wherein extreme magnification refers to magnification greater than 50×, greater than 100×, typically greater than 1,000×, greater than 10,000×, or even $1 \times 10^6 \times$ or greater. The signal is not distorted (magnified or compressed) in the Y-direction, as this is unnecessary for analysis of the graph shown and would only make it more complicated for the user to analyze the graph, particular in terms of signal magnitudes in the Y-direction.

The open region 20, which appears like a cylindrical magnifying lens on the display 10 is easily movable and adjustable by the user. The user can freely move the lens 20 to the left or the right by simply clicking and dragging with a mouse, for example, to move the cursor 14 to the desired location of the center of the open view relative to the graph 12. The movement of the cursor 14 results in real time changes in the open portion of the graph 12 that are immediately displayed. Alternative control mechanisms for moving the cursor include, but are not limited to keyboard keys, a knob or another control. Similar controls are provided for controlling the width of the window (open region) and the magnification provided within the window.

Figure 3:
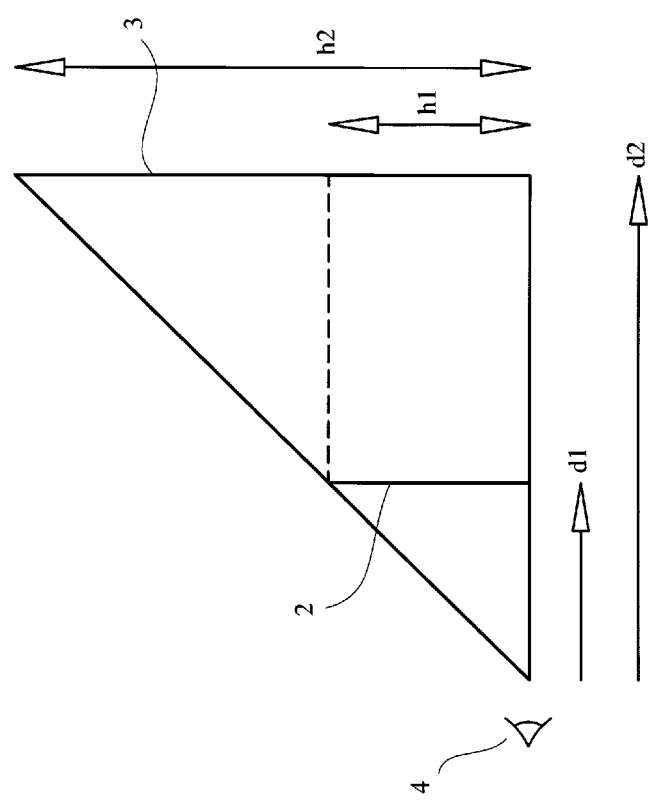
FIG. 3 schematically illustrates the principle that objects close to the eye appear larger than objects of the same size that are distant from the eye.

The mathematics supporting the "open" function is not based on the optics of lenses, hence, the "lens" analogy described above is just that, an analogy. Rather, the "open" function of the present invention functions according to a distance-based optical model, including the fact that objects close to the eye appear larger than objects of the same size that are distant from the eye. FIG. 3 illustrates this principle. In FIG. 3, an object 2 having a height of $h_1$ at a distance $d_1$ from a user's eye 4, appears to be as tall as a taller object 3 having a height $h_2$, but located at a further distance $d_2$ from the user's eye 4. The apparent magnification, m, of the object 2 relative to object 3 is characterized by:

$$m = \frac{h_2}{h_1} \quad (1)$$

However, simple geometry of right angle triangles yields the following equivalent formula in terms of distance:

$$m = \frac{d_2}{d_1} \quad (2)$$

It is also possible to define magnification based on the angle subtended by the object. This is referred to as angular magnification and is typically used for true lens-based systems such as telescopes and microscopes. For small angles, angular and linear magnifications are substantially equivalent. For the purposes of creating a display, rather than working in terms of distance from the eye, distances from a base plane are considered, and the display is an imaginary representation of looking down at a document from above. Thus, it can also be considered that the "height" above the base plane is being represented by the magnification of that which is displayed.

Figure 4:
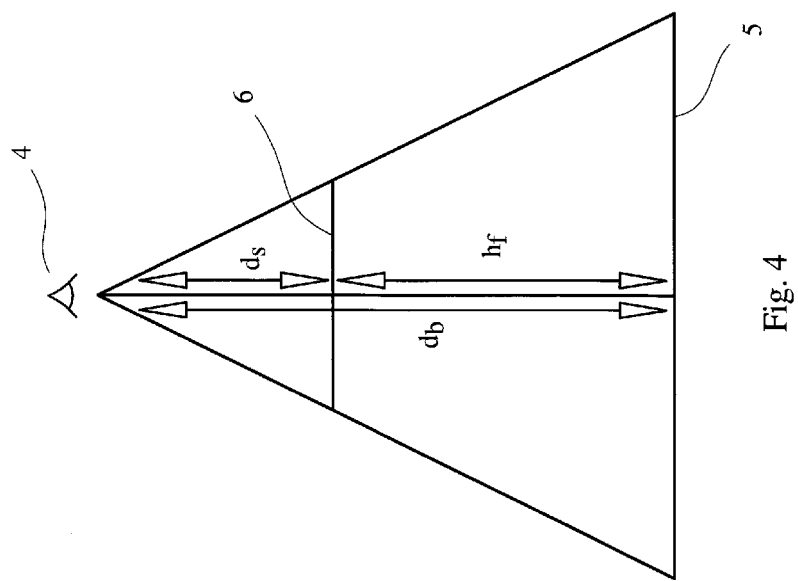
FIG. 4 schematically shows the distances or heights, relative to a base plane, that are represented in the magnification model used in the present invention.

FIG. 4 schematically shows the distances or heights, relative to a base plane 5 that are represented in the magnification model. Here, $d_s$ is the distance from the observer's eye 4 to the magnified "surface" 6, $d_b$ is the distance from the observer's eye 4 to the base plane 5 and $h_f$ is the height (distance) from the base plane 5 to the surface 6. From this, and referring to equation (2) the apparent magnification, m, can be rewritten as:

$$m = \frac{d_b}{d_b - h_f} \quad (3)$$

It is possible to provide a bifocal display in which a line graph is shown at two magnifications. However, this generally causes the magnified region of the graph to occlude one or more portions of the graph that has not been magnified. The present invention avoids this undesirable result by performing magnifications that vary over a continuous range of magnifications across the open region so that locations near the boundary between the open region (portion of graph being magnified) and the remainder of the graph are less magnified and not occluded. This can be accomplished by varying the magnification from no magnification at the boundary to the desired magnification at the center of the open portion. This is accomplished by replacing $h_f$ in equation (3) with a function providing a variable distance (height) and thus a variable magnification. The effect can be described as if the surface being viewed is a rubber sheet and the user wishes to push a portion of the sheet closer to the user's eye to show a magnified view (open portion) of the same, while the other portions of the sheet remain at the same distance. However, in order to maintain continuity, the rubber sheet stretches, at the boundaries between the open portion and the fixed portions, to occupy variable distances from the user's eye. For example, the sheet is glued at its x-axis boundaries, so as to be fixed at the base distance at all portions of the sheet outside of the area to be opened.

For the case of time series line graphs generated by measurement instruments, the above-described deformation is only performed in one dimension, i.e., along the time dimension. A further simplification involves normalizing an arbitrary half-width of the cylindrical lens representation (i.e., half the width of the open region (magnification window) 20) to a value of 1. Accordingly, the function that replaces $h_f$ can be defined only over the x-axis interval from 0 to 1. The resulting magnification factor can be rescaled to the actual lens half-width. Thus, in traversing the width of the magnification window 20 from one boundary to the other, the magnification changes from unity to the selected magnification and back again to unity in accordance with a specified linear or non-linear magnification (height) function that includes a drop-off factor. Magnification factors and drop-off factors are described in more detail below. By normalizing as described, this allows a wider choice of functions to be used to define the variable magnification, as the only constraints are that the function be defined at the two points (0,1) and (1,0) and that the function be continuous and positive over the entire interval between those two points.

Figure 5:
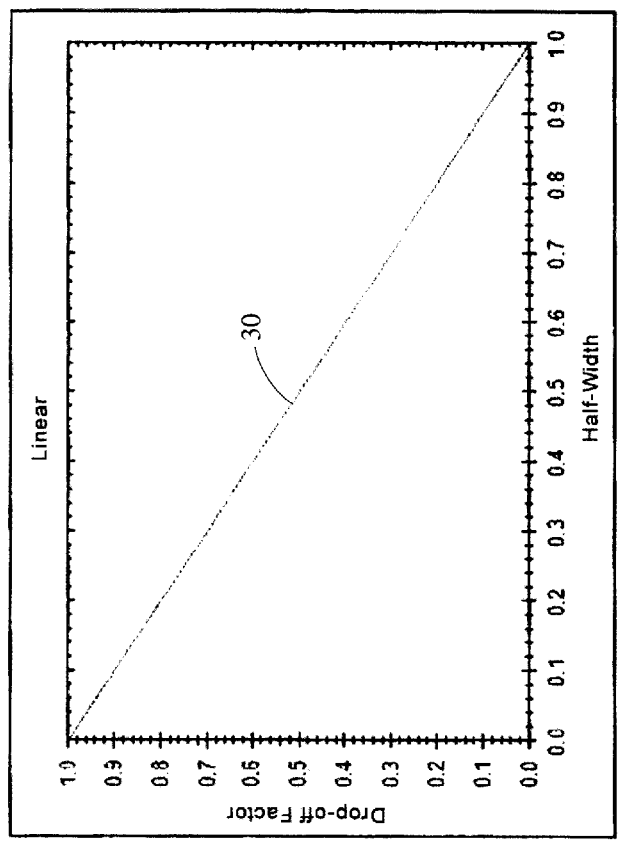
FIG. 5 graphically illustrates a linear variable magnification function that may be employed by the present invention.

The simplest variable height function is a linear function defined by a straight line defined between the two points mentioned above. FIG. 5 illustrates this height (magnification) function 30 graphically. The variable height function $h_f(x)$ is defined by:

$$h_f(x) = 1 - x \qquad (4)$$

where "x" is the value shown along the X-axis in FIG. 5.

Figure 6:
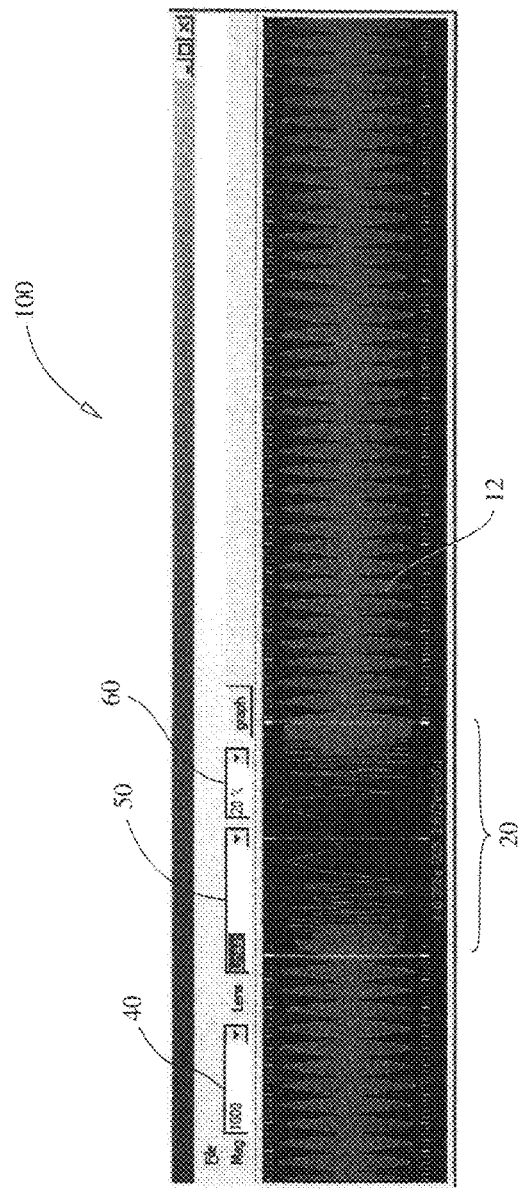
FIG. 6 illustrates an open portion in which a linear variable magnification function has been applied.

When "$h_f(x)$" in equation (4) is substituted for "$h_f$" in equation (3) and the modified equation (3) is applied to an oscilloscope trace 12 with sufficient magnification (e.g., a magnification of 1000 was applied in FIG. 6), the resultant view is displayed as shown in FIG. 6. In this view, the oscilloscope trace 12 includes 65,534 time points of a modulated signal, and the open region 20 is displayed with a variable magnification having a linear drop-off towards the peripheries of the open region. The open region 20 occupies twenty percent of the overall display of the graph 12 in this example. Note also that user interface 100 includes a feature 40 for setting the peak magnification at the center of the open portion 20. The magnification drops to zero at the x-direction peripheries of the open portion 20. Hereafter, unless otherwise specified, the term "magnification used in this context is used to mean the peak magnification. of the open portion 20. This magnification may be selected from a list of predetermined magnifications in a drop down menu. Alternatively, the user may type in a specific magnification. Also, a feature 50 for user selection of the drop-off function to be used is provided. As already noted, a linear drop-off function was chosen for the view displayed in FIG. 6. Other drop-off functions that may be alternatively selected and applied include, but are not limited to: quadratic, hyperbolic, and Gaussian. The percentage of the display that is to be taken up by the open portion 20 is also user selectable via feature 60. As noted, the user has selected that the open portion take up 20% of the overall display of graph 12 in FIG. 6.

Figure 7:
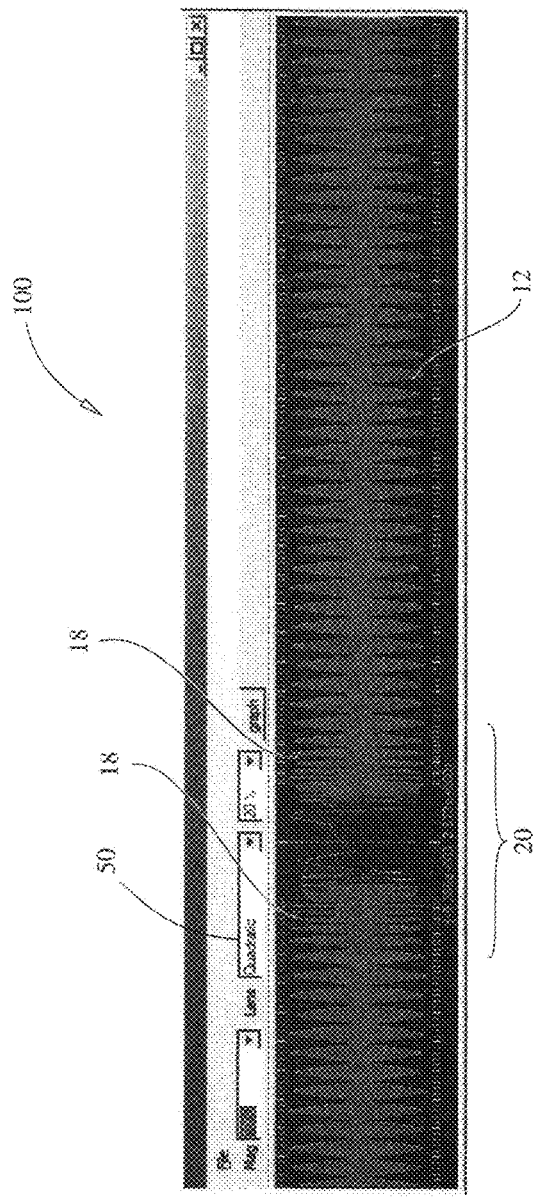
FIG. 7 illustrates an open portion in which a quadratic variable magnification function has been applied.
Figure 8:
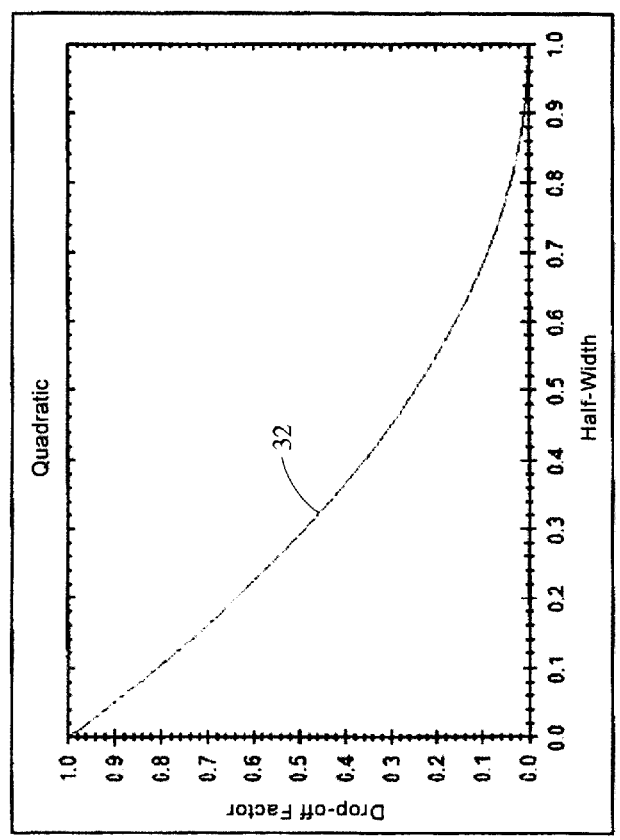
FIG. 8 graphically illustrates a quadratic variable magnification function that may be employed by the present invention.

In the example of FIG. 6, the linear drop-off function results in the peripheral portions within the open portion view 20 to be very dense since their magnification is minimal, so that not much context detail can be seen at the left and right peripheral portions of the open portion 20. Selecting a quadratic variable magnification function results in the display showing more detail near the peripheral parts of the portion 20, as shown in FIG. 7. It can be seen that the periodicity of the signal is still visible even in the peripheral regions 18, with the tradeoff being that the width of the central portion of the open portion, where the magnification is at or near its maximum, is a little narrower. The quadratic drop-off function in this instance is defined by:

$$h_f(x) = (1-x)^2 \qquad (5)$$

and is illustrated graphically as drop-off function 32 in FIG. 8.

A hyperbolic drop-off function can be used, and is a highly efficient alternative, since this function requires only simple arithmetic for its calculation. The hyperbolic drop-off function used is defined by:

$$h_f(x) = \frac{1}{x+c} - c \qquad (6)$$

where "c" is a constant that is carefully chosen so that the function $h_f(x)$ intersects the points (0,1) and (1,0) on a chart like that shown in FIGS. 5 and 8. After some simple algebra and solving the resulting quadratic equation for c, such that the function intersects the points (0,1) and (1,0), c is defined as:

$$c = -1 + \frac{\sqrt{5}}{2} \qquad (7)$$

Figure 9:
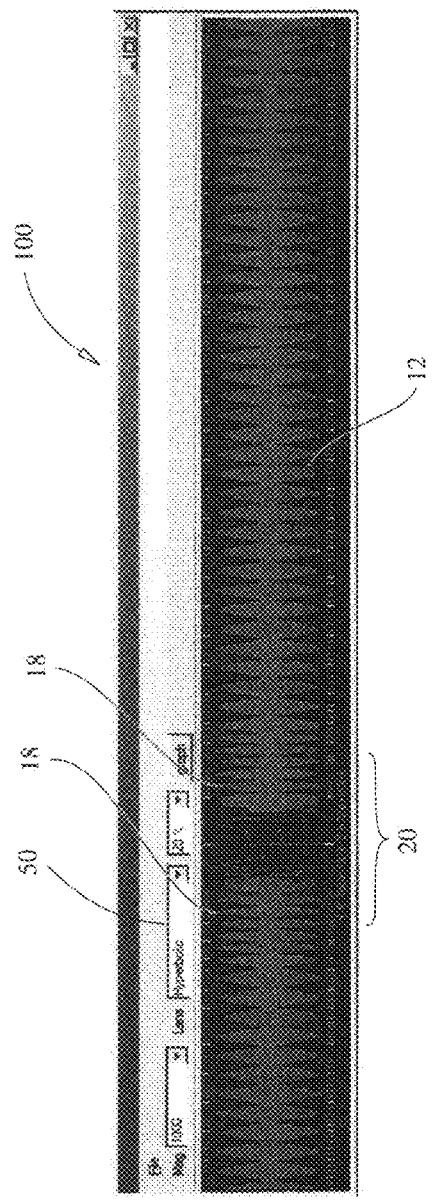
FIG. 9 illustrates an open portion in which a hyperbolic variable magnification function has been applied.

The hyperbolic drop-off function applied to the open portion as an alternative to the displays in FIGS. 6 and 7 yields even more detail in the peripheral parts 18 of the open portion 20 as shown in FIG. 9.

Figure 10:
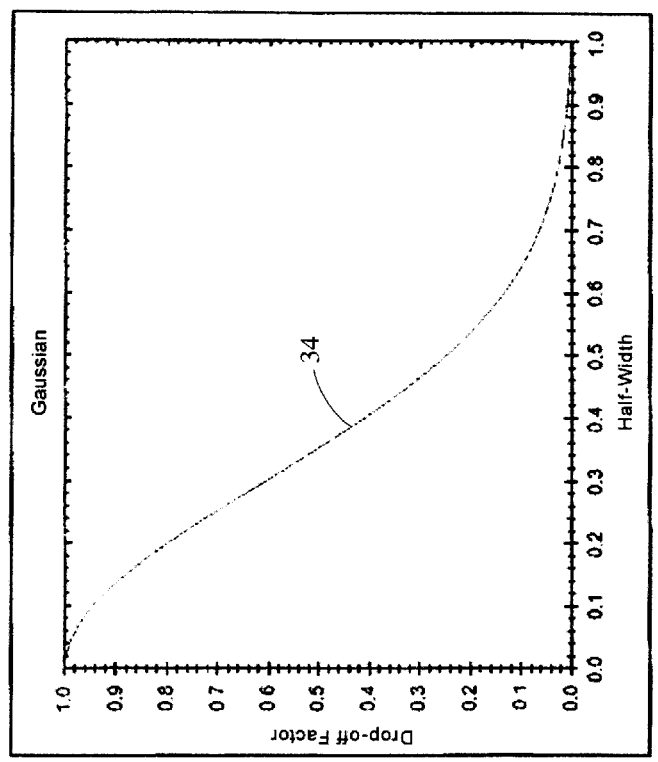
FIG. 10 graphically illustrates a Gaussian variable magnification function that may be employed by the present invention.

Other shapes of drop-off functions $h_f(x)$ may be used, including, but not limited to, a smooth Gaussian shape 34 as illustrated in FIG. 10. As noted previously, the drop-off factor computations are restricted to apply only over the range of $\pm r_i$, i.e., ±the distance of the radius (half the width) of the open portion, centered around the center of the width of the open portion. To do this, coefficients are computed for the Gaussian curve to ensure that it was negligibly small at the normalized value of x=1, see FIG. 10. For x>1, the value of $h_f(x)$ is simply set to zero (assumed to be zero).

The use of any of the above-described drop-off functions causes the magnification to be at full magnification at the center of the open portion 20, with reduction in magnification beginning immediately to both sides of the center of the open portion 20. This can be problematic with digitally displayed signals as it may result in a relatively steep rise or fall of a signal appearing at the central, full magnification location to appear as an "S-curve". To remedy this, the fixed magnification (full magnification) may be applied to a central region 16 of the open portion (i.e., the area within grid 17 shown in FIG.

12), with the variable magnification function applied only from the edges of central region 16 to the periphery of the remainder of open portion 20.

Figure 11:
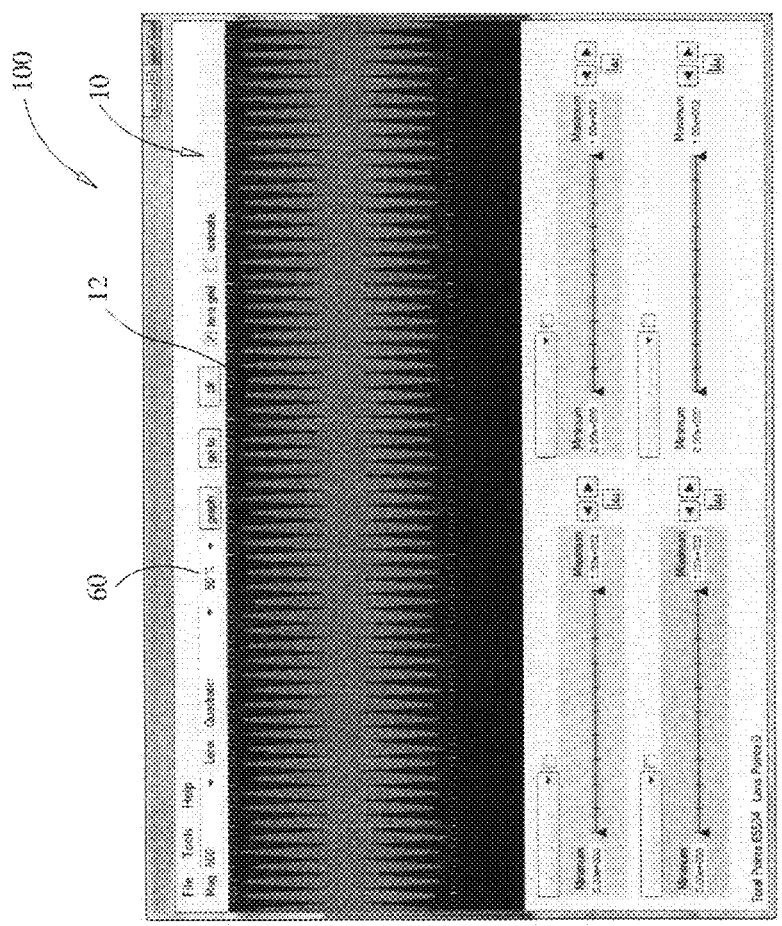
FIG. 11 shows another example of a dense, time series graph displayed on an user interface display of a system according to the present invention.

FIG. 11 shows another example of a dense, time series graph 12 (in this case an amplitude modulated (AM) signal generated by an Agilent demonstration board) displayed on the display 10 of user interface 100. The carrier frequency of the signal displayed as graph 12 is 2 MHz. The modulating frequency is about 440 kHz. However, the amplitude of every second envelope has a slightly different amplitude when compared to the previous envelope. That is, a slight variation in the visible modulation of the graph 12 can be seen, such as at 60, referred to here as a "whisker". This whisker 60 appears as a discontinuity in the carrier every second envelope, or at an approximate repetitive rate of about 220 kHz This discontinuity is synchronous with the overall modulating frequency, not the carrier signal, and hence each occurrence of the discontinuity appears differently depending upon the phase relationship of the modulating and the carrier signals.

Figure 12:
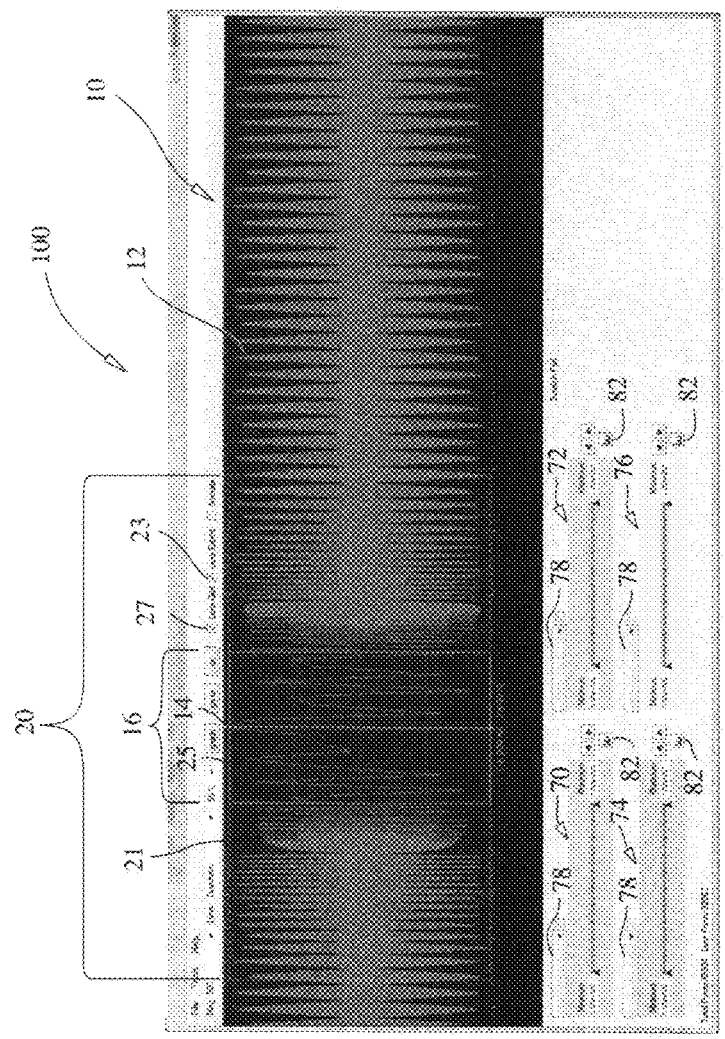
FIG. 12 illustrates an open portion having been opened up in a region of the graph shown in FIG. 11 where an anomaly exists.
Figures 13, 14:
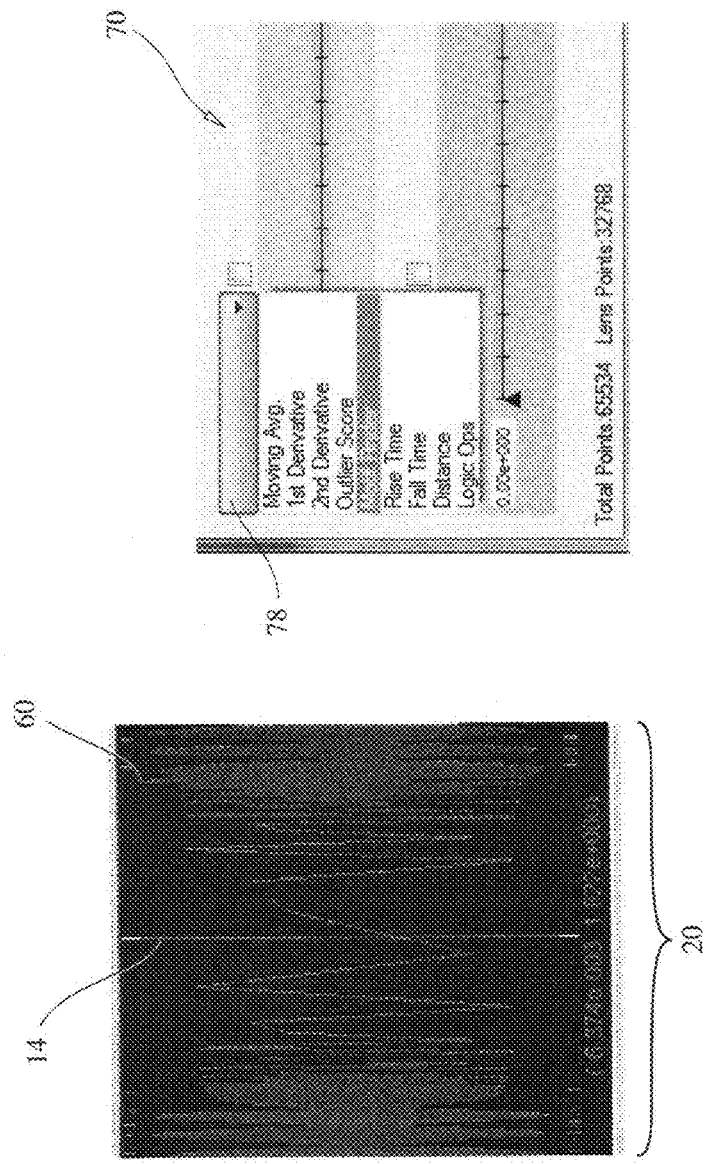
FIG. 13 illustrates that the user interface may navigate along the time axis to adjust the position of the cursor relative to the graph along the time axis.
FIG. 14 illustrates various measurement functions that can be performed according to the present invention.

By selecting the original waveform at or near one of these whiskers 60, the user causes user interface 100 to open up an open portion 20 as shown in FIG. 12, wherein the magnification has been set to 500 and a quadratic variable magnification function has been selected to provide a region 16 of maximum magnification. A dashed grid 21 is displayed to outline the magnification window/open region when box 23 is selected. Likewise, a solid rectangular box 25 is displayed to show the extent of the window 20 that is displayed at the maximum constant magnification when box 27 is selected. The user can select on the cursor 14 and, by holding the left mouse button down, drag the curser to the left or to the right to vary the location of the open portion 20 in real time. Alternatively, left and right arrow keys on the keyboard can be used to navigate the cursor 14 more precisely. Since the data of graph 12 is dense, and the user can only click on a portion of the graph 12 at the pixel resolution of display 10, the cursor 14 of the open view 20 may not appear exactly at the intended location when the view 20 is opened. However, even if the user does not successfully open the graph at the exact desired location, the location of the open portion 20 can be readily moved without the need to close it again and re-open it at a different location. FIG. 13 illustrates how the local context within the open view 20 aids in navigation. Since, in open view 20, the cursor 14 is somewhat to the left of the whisker 60, the arrow keys of the keyboard of the user interface 100 can be used to navigate on a much finer movement scale within the open view to center the whisker 60 at or about the cursor 14 for maximum magnification, although if the whisker is displayed anywhere within region 16, it will be displayed with maximum magnification.

Upon inspection of the whisker 60 in the magnified view 16, the user may note that the whisker 60 does indeed appear to be an anomaly or "glitch" in the signal. Upon viewing this, a user may suspect that something anomalous is occurring in the waveform 12 at this location that may warrant further analysis. The user interface 100 is provided with various measurement features that can be used to measure various characteristics of the graph 12. Measurement selection features 70, 72, 74, 76 (four are shown, but the different embodiments may include fewer or more than four) are provided to allow the user to customize the types of measurements and analyses to be performed on the graph 12 and/or magnified portion 16. Each measurement selection feature includes a drop down menu from which a particular measurement function to be performed may be selected by the user. In FIG. 14, the user has actuated the drop down menu 78 of measurement selection feature 70 and has selected the function "motif finder" (as indicated by the highlighted menu item) to be performed. In at least one embodiment, the motif is defined by the cursor (center of the open region 20) and the user supplied value of "width" (see FIG. 15) that is selectable by the user in the "Find Motif" dialog box 79 that is displayed upon selecting "Motif Finder" as described above with regard to FIG. 14. This width is the area centered around the current cursor 14, that has a width along the X-axis as specified, and that defines the region to be compared to, i.e., the motif. As the value of width is changed by the user, the marked region 19 (which is highlighted, outlined and/or colored or otherwise marked differently from its surroundings, for example) changes its width to correspond to the specified width value to apprise, in a graphical display, the width that is being considered for use in motif finding. The system executes the motif finder function to match additional portions of the dense, time series graph 12, that are not within the open portion 20, with a characteristic waveform selected within the open portion 20 and defined in marked region 19. This is carried out by comparing a portion the dense, time series graph where the motif is defined (i.e., within the magnified portion 16) with a remainder of the dense, time series graph 12 to identify wave forms similar to the wave form characterizing the motif Many techniques have been developed to find motifs in line graph data. Hochheiser, Interactive Graphical Querying of Time Series and Linear Sequence Data Sets, in Dept. of Computer Science 2003, University of Maryland, provides a good overview of techniques for motif finding, and is incorporated herein, in its entirety by reference thereto. In this case a motif is a recognizable and characteristic pattern in the line graph curve. Another specific algorithm preferably used for motif matching according to the present invention is described in co-owned, co-pending application Ser. No. (application Ser. No. not yet assigned) filed concurrently herewith and titled "System and Method for Correlation Scoring of Signals". Application Ser. No. (application Ser. No. not yet assigned) is hereby incorporated herein, in its entirety, by reference thereto.

Upon identifying motif matches according to the parameters set by the user on user interface 100, track marks 91 are displayed in a track 90 adjacent (beneath, in FIG. 16) the graph 12, along the X-axis, wherein each track mark 91 corresponds to the time location on the graph 12 where each identified matching motif is located, respectively. Accordingly, track 90 includes all track marks 91 locating matching motifs in the graph 12. Note that track marks that correspond (i.e., which are aligned with) the portion of the dense graph 12 that is distorted in the open view are distorted proportionately to the amount of distortion of the graph. This can be readily observed in FIGS. 16, 18 and 19, for example.

Figure 16:
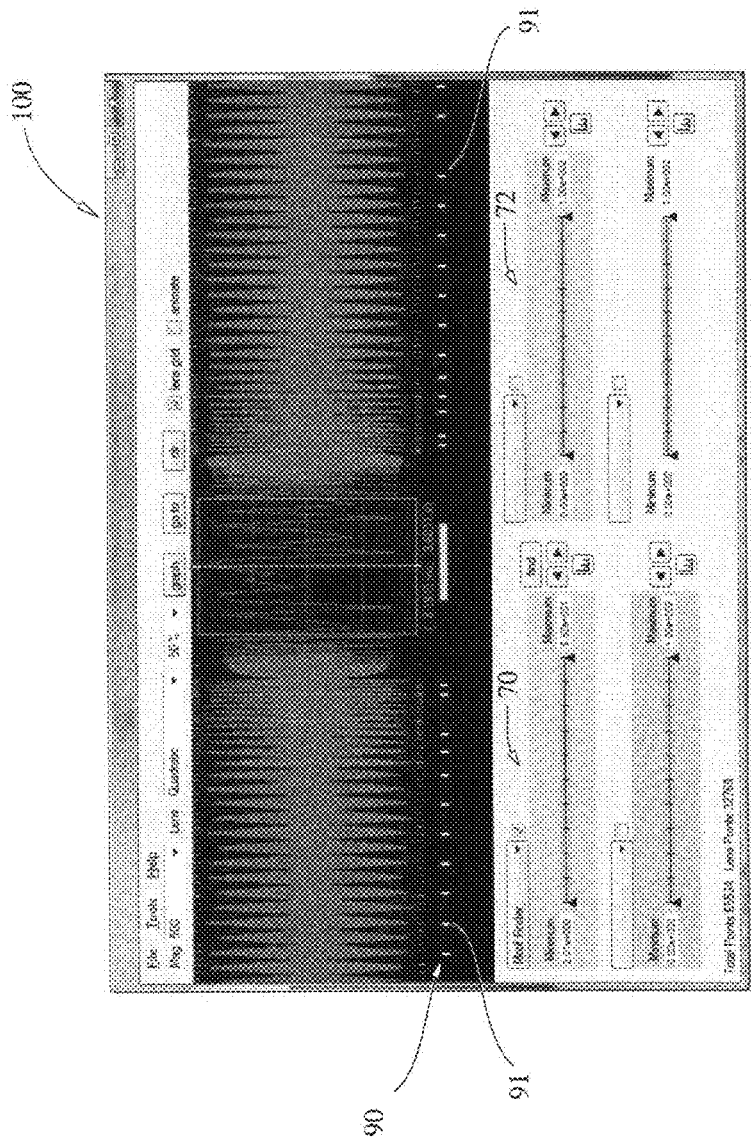
FIG. 16 illustrates tracks having been displayed to illustrate the locations, along the time axis, on the dense, time series graph, where motif matches to the anomaly identified in FIG. 12 exist.
Figure 17:
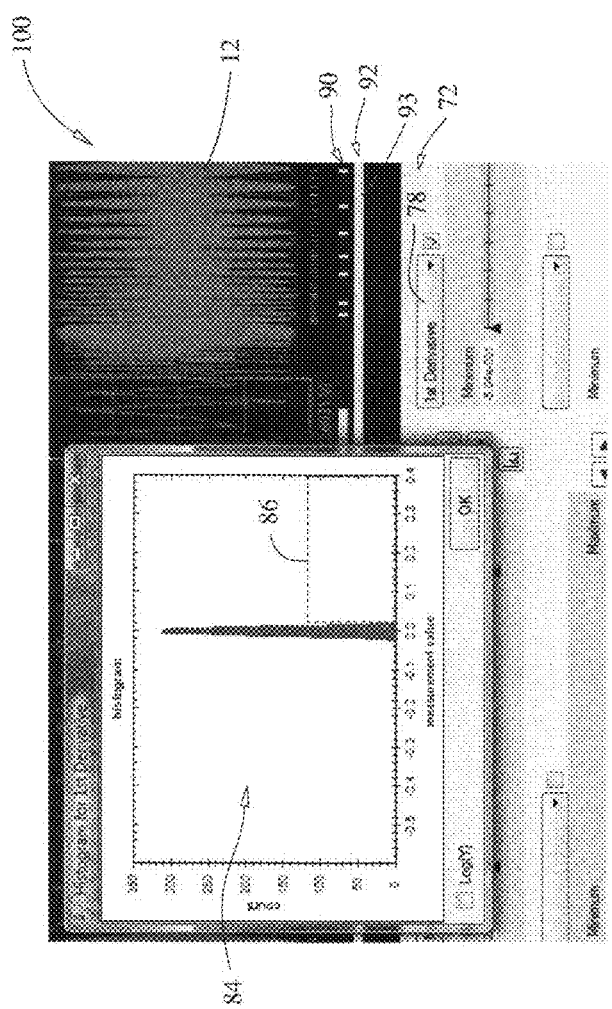
FIG. 17 illustrates a histogram overlaid on the display of the user interface, the histogram showing the distribution of the calculated first derivative values calculated with regard to the dense graph.

FIG. 17 is a partial view of user interface 100 showing that the user has additionally made a selection from the drop down menu 78 of measurement selection feature 72 to cause the system to calculate a second measurement in addition to the motif matching measurement (first measurement) described above. In this case, the second measurement calculated is the "first derivative" of the signal. Additionally, for this measurement, the user has selected (e.g., by clicking on histogram feature button 82) the histogram feature 82, causing a display 84 of the distribution of the calculated first derivative values to be shown overlaid on the graph 12 on display 10. Next, the user can select the section of extremely high value outlying slopes (i.e., first derivative values), as shown in the dotted box 86 in FIG. 16, as this should include the discontinuous "whiskers" 60 occurring in the waveform 12. By zooming the histogram view 84 as shown in FIG. 16, this also filters the main display of the graph 12 to shown only those values that are visible in the zoomed histogram. Note that a second track 92 of track marks 93 has been displayed in FIG. 17 to correspond to those locations, on the time scale, where the outlier, extremely high slopes of the graph 12 occur, in accordance with the selection 86.

Figure 18:
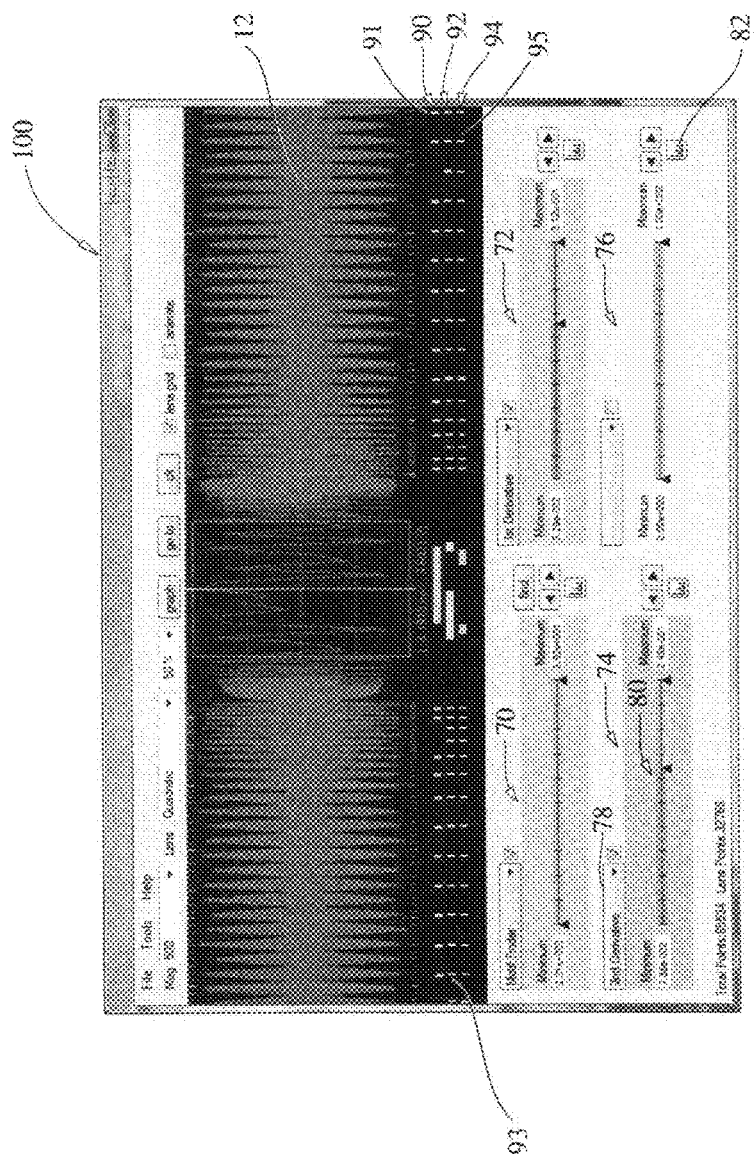
FIG. 18 shows that the user has additionally made a selection to cause the system to calculate a third measurement.

Similarly, each of the measurement selection features 70, 72, 74, 76 can be used to perform a different measurement on the graph data 12. FIG. 18 shows that the user has additionally made a selection from the drop down menu 78 of measurement selection feature 74 to cause the system to calculate a third measurement in addition to the motif matching measurement and first derivative measurement described above. In this case, the third measurement calculated is the "second derivative" of the signal. Note that a third track 94 of track marks 95 has been displayed in FIG. 18 to correspond to those locations, on the time scale, where the second derivative measurements having values greater than or equal to the minimum value set by the user on slider 80 of measurement selection feature 74, and less than or equal to the maximum value set by the user of slider 80 of measurement selection feature 74, occur. Each track 90, 92, 94 may be color coded to correspond to a color encoding the corresponding measurement selection feature 70, 72 and 74 that instructed the measurement of the values corresponding to those tracks, and/or track may be numerically labeled to correspond to a number assigned to the respective measurement selection features, and/or the tracks can be displayed in an order from top to bottom which correspond to the order of the corresponding measurement selection features as they appear on the user interface.

Figure 19:
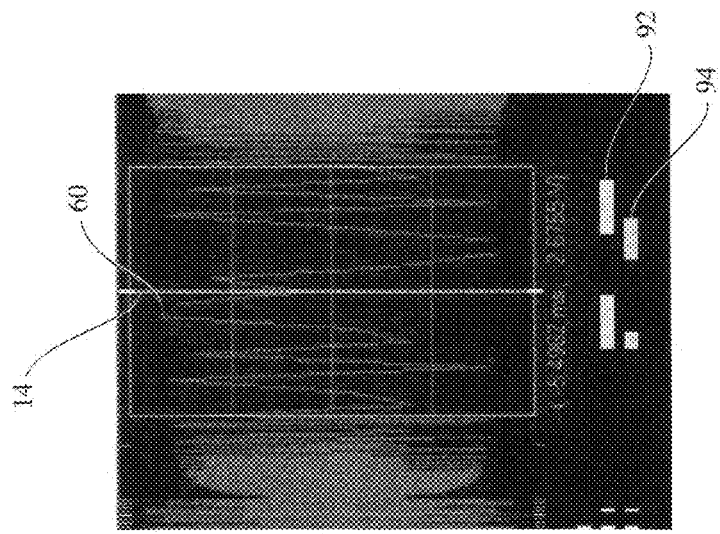
FIG. 19 illustrates an open portion of the graph shown in FIG. 18, the portion having been opened where a motif track is not displayed aligned with second and third measurement tracks.

It can be readily seen that all of the measurements indicated by the track marks 91, 93 and 95 of the tracks 90, 92 and 94, respectively, appear to substantially line up in columns and show a pronounced periodicity. There are a few instances where the motif matching track marks 91 of track 90 are missing in locations where first and second derivative track marks 93, 95 of tracks 92, 94 are substantially aligned. By navigating to one of the locations where the first and second derivative track marks substantially align, but where the motif track mark 91 is absent, and opening that portion of the graph 12 as illustrated in FIG. 19, the user can visually discern that there is indeed a whisker 60 in the waveform, although is it less pronounced then some of the other whiskers 60 and was therefore too subtle to be matched with the motif finder.

Figure 20:
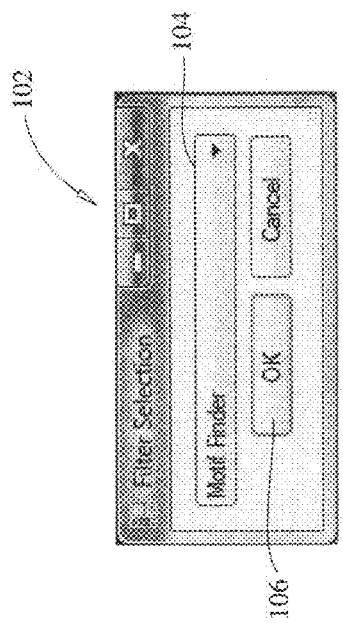
FIG. 20 illustrates a "Filter Selection" dialog according to the present invention.
Figure 21:
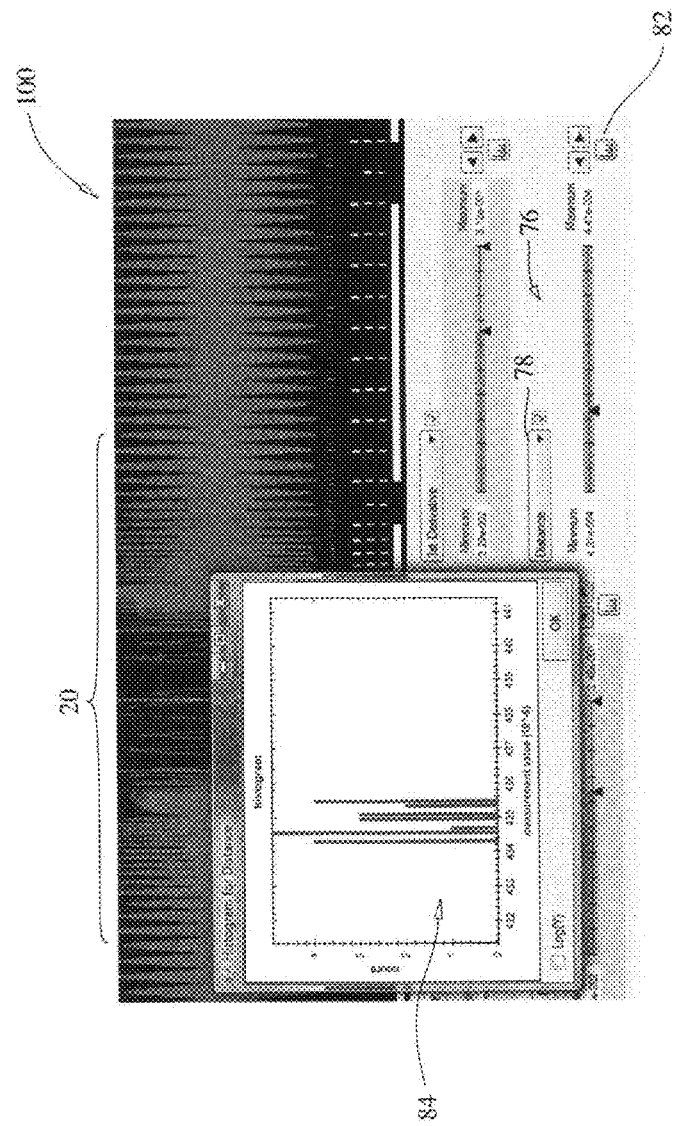
FIG. 21 illustrates a Histogram for Distance overlaid on the main display of the user interface.

Further, the periodicity of the whisker 60 can be calculated. For example, in the fourth measurement selection feature 76 the user can use the drop down menu 78 to select "Distance". This further causes the display of a "Filter Selection" dialog 102 to be displayed, an example of which is shown in FIG. 20. From the filter selection dialog 102, "Motif Finder" is selected from the drop down menu 104. This causes the system to compute the distance between each matched motif. By clicking the "OK" box 106, the system performs the distance calculations. By pressing/selecting the corresponding histogram button 82 (see FIG. 21) the user can use the displayed histogram 84 (see FIG. 21) to zoom in on the major cluster of values that corresponds to the interval between the nearest, non-skipped glitches. The interval can then be estimated by inspecting the histogram and 84 noting that it is centered around about $435 \times 10^{-6}$ seconds, see FIG. 21.

Figure 22:
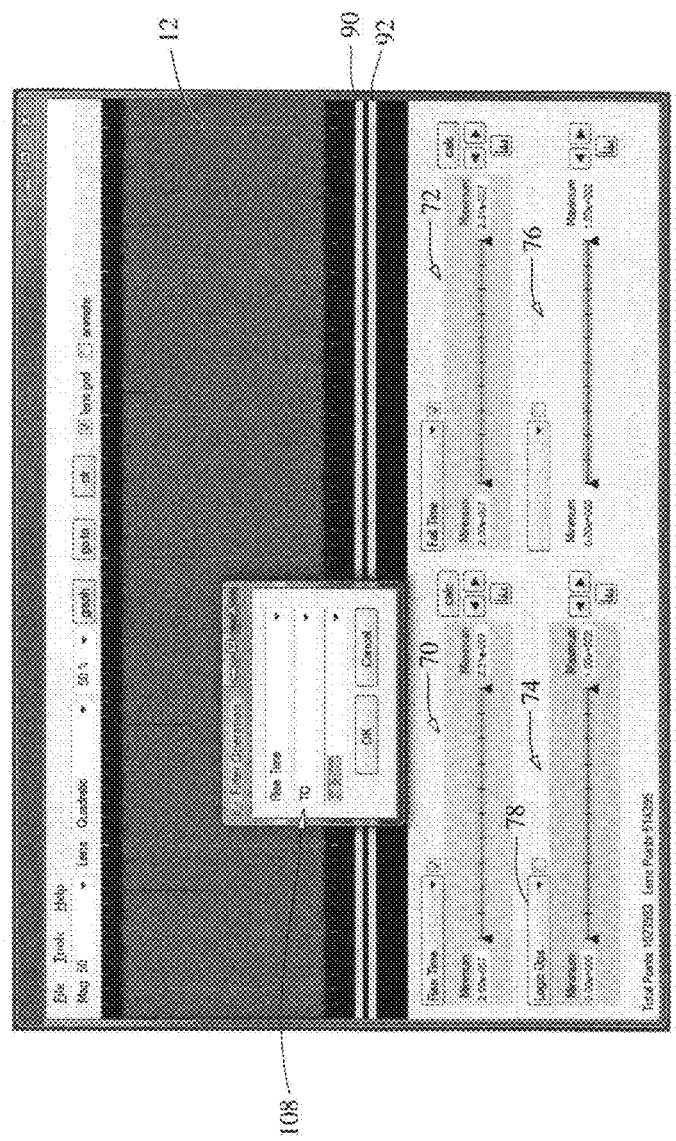
FIG. 22 illustrates a filter operation used to perform a logical operation measurement according to the present invention.

FIG. 22 illustrates an example of the versatility of the system provided by the variety of different measurements and further functions that may be performed relative to the measurements. In this example, graph 12 is made by displaying the waveform of PCI Express data including 1,023,983 data points, which is very dense, making it difficult even to visualize periodicity of the waveform 12. In this instance, measurement selection feature 70 has been used to calculate the rise time of the waveform 12, measurement selection feature 72 has been used to calculate fall time of the waveform 12, and measurement selection feature 74 has been used to select performance of logical operations (i.e., "Logic Ops"). In this case, a measurement of measurements is computed by the logical operations. In the filter operations dialog box 108 displayed for measurement selection feature 74 when "Logic Ops" is selected in drop down menu 78, the logical operation selected by the user to be calculated is "rise time to fall time". The computation of rise time to fall time is tantamount to measuring the peak width of the waveform 12. Note that the "Logic Ops" function is not limited to calculating rise time to fall time, but can be used to calculate any "logical AND" or "logical OR" combination of two other measurements calculated by the system.

Figure 23:
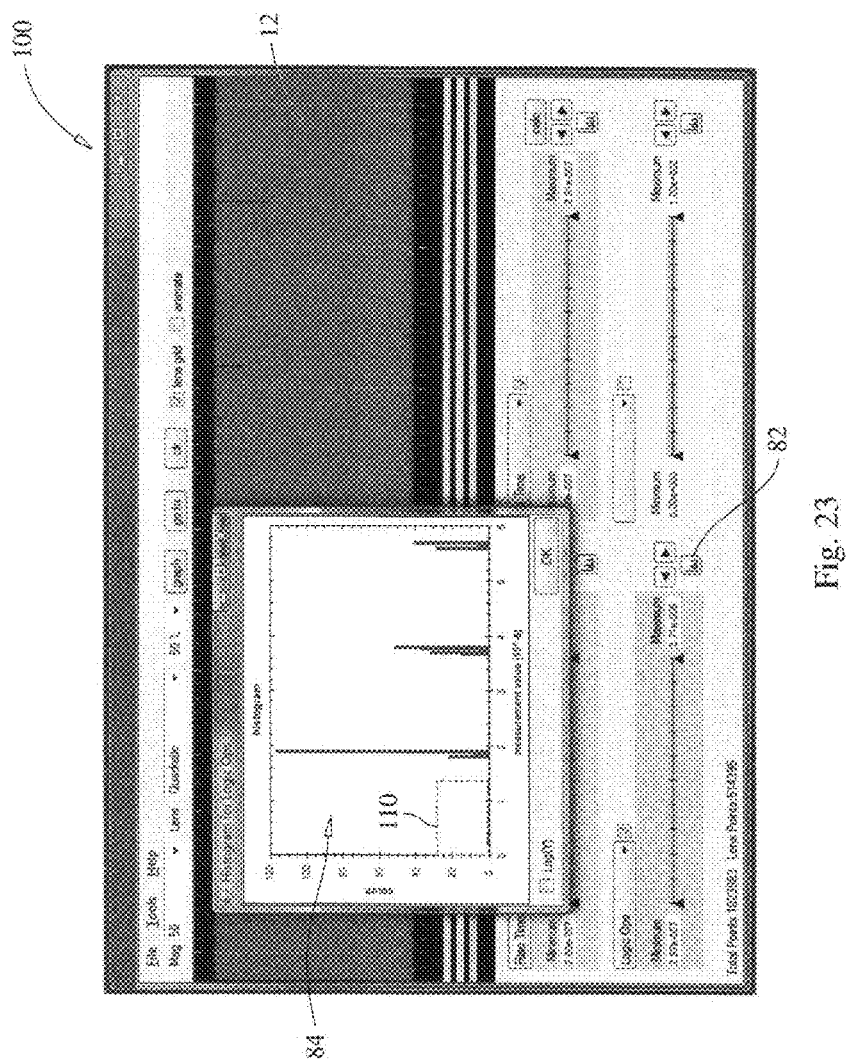
FIG. 23 illustrates a histogram for the Logic Ops measurement carried out according to the example of FIG. 22.

After the Logic Ops computations are complete, the histogram for the Logic Ops measurement is invoked by clicking on 82 (see FIG. 23) and a histogram 84 is displayed that shows a histogram of the results of the Logic Op computations. It can be observed that the majority of the peaks correspond to a 2:4:6 ratio that is to be expected from PCI Express data. However, upon looking more carefully, there are a few counts to the left of these dominant occurrences around 2, 4 and 6. These few counts can be zoomed into by selecting them as indicated by the dotted rectangle 110.

Figure 24:
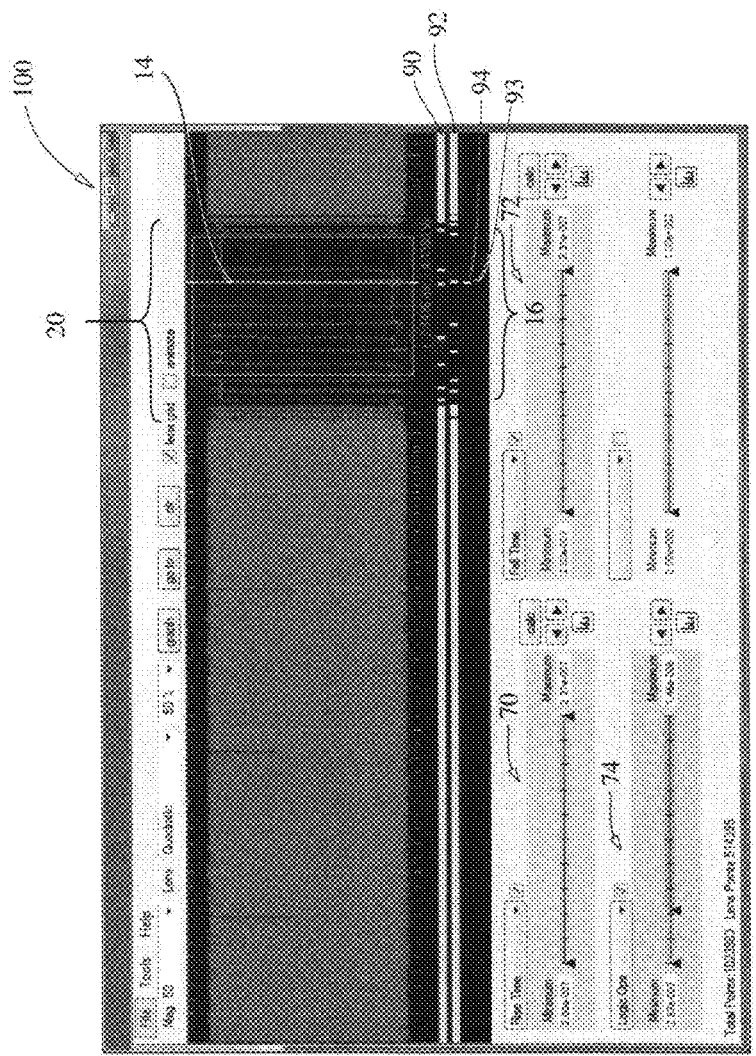
FIG. 24 shows the open region resulting from the selection, wherein only one track appears indicating a result of the Logic Ops measurement described with regard to FIGS. 22-23.

The selection 110 causes track marks 95 to be displayed in track 94 to identify the locations of the counts identified in the dotted rectangle 10. FIG. 24 shows the open region 20 resulting from the user navigating the cursor 14 to one of the locations of the track marks 95. By navigating the cursor 14 to the location of the track mark 95 as shown, it is observed that the time value is 2.1426 ms and that an uncharacteristically narrow peak occurs there.

Figure 25:
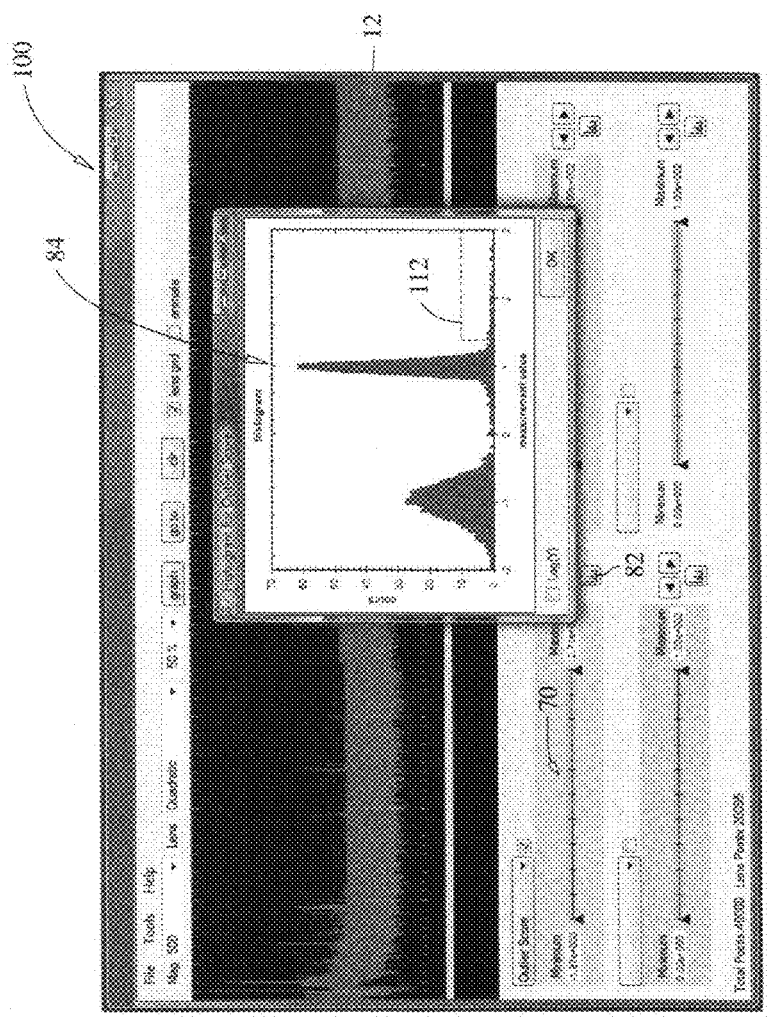
FIG. 25 shows a user interface, according to the present invention, displaying a dense, time series graph that is a frequency spectrum showing interesting peaks in the FM (frequency modulation) band and a strong test signal broadcast at 4 GHz.
Figure 26:
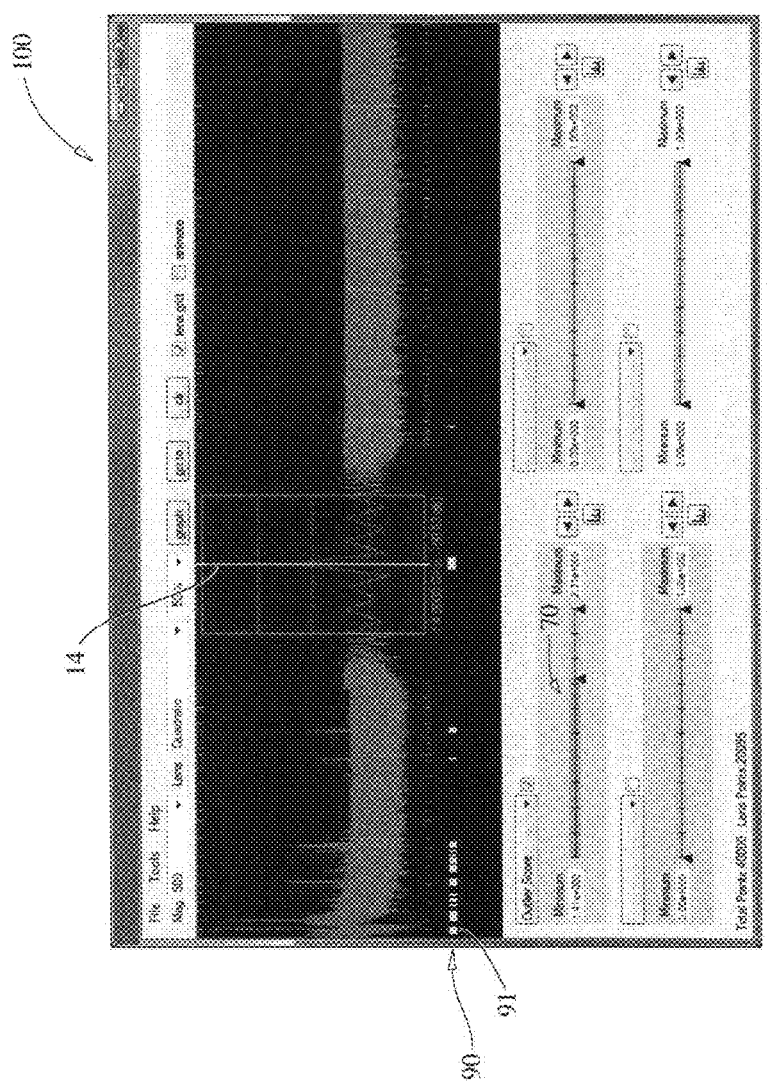
FIG. 26 illustrates a magnified (open) view of the portion of the graph that corresponds to that track mark indicating the strong test signal being broadcast at 4 GHz.

The present invention can also be used with frequency domain data. In FIG. 25, user interface 100 displays a dense, graph 12 that is a frequency spectrum showing interesting peaks in the FM (frequency modulation) band and a strong test signal broadcast at 4 GHz. In FIG. 25, the user has selected to compute the measurement for "outlier score" at measurement selection feature 70. By selecting the histogram button 82, histogram 84 is displayed, showing counts along the Y-axis and frequency along the X-axis. Values are binned at intervals, and each value in the histogram represents how many measurements were found in that "bin". Selection of the highest values shown in the histogram (see rectangle 112) causes the data points in graph 12 that are significant outliers from the local mean value to be selected, having the effect of marking signals protruding form the noise with track marks 91 in track 90 as shown in FIG. 26. The user can navigate to any of the locations of the track marks 91 to provide open view 20 of the portion of the graph that corresponds to that track mark 91 along the frequency scale. FIG. 25 shows that the user has opened the graph 12 at 4 GHz, where the cursor 14 aligns with the strong test signal being broadcast at 4 GHz.

Figure 27:
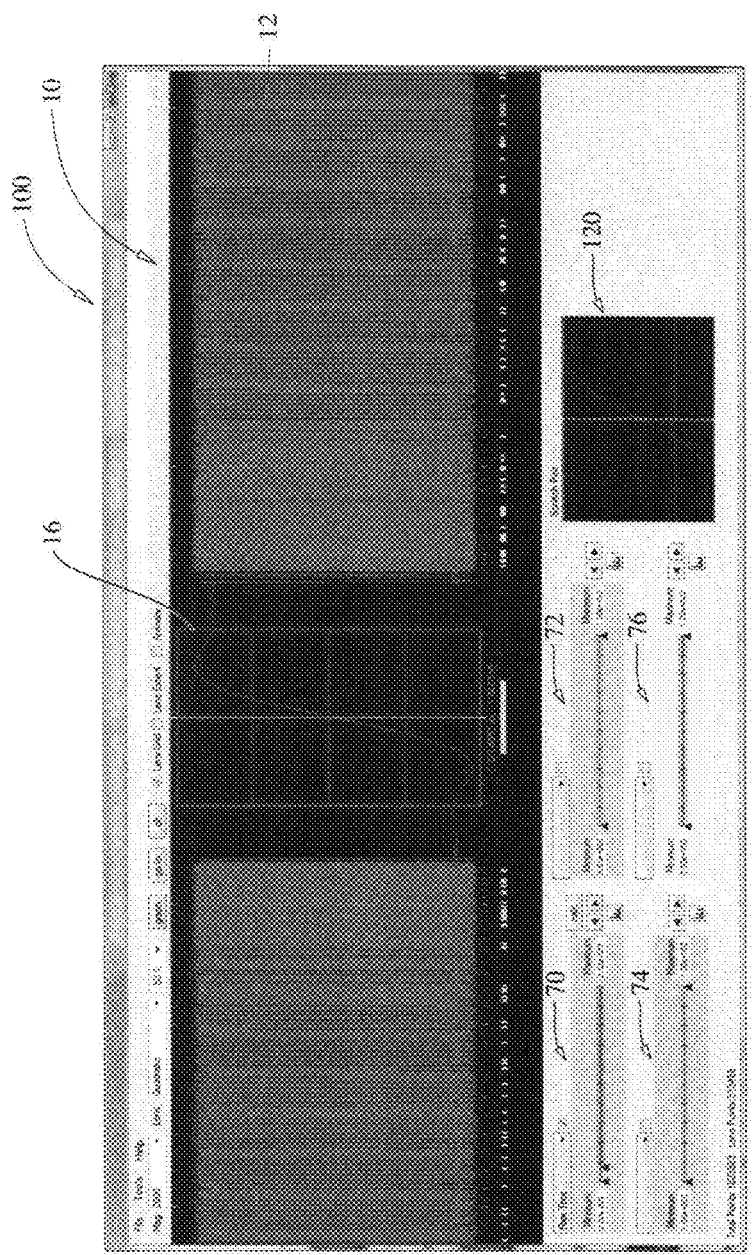
FIG. 27 illustrates an embodiment of the user interface of the present invention that includes a scratch pad.
Figure 28:
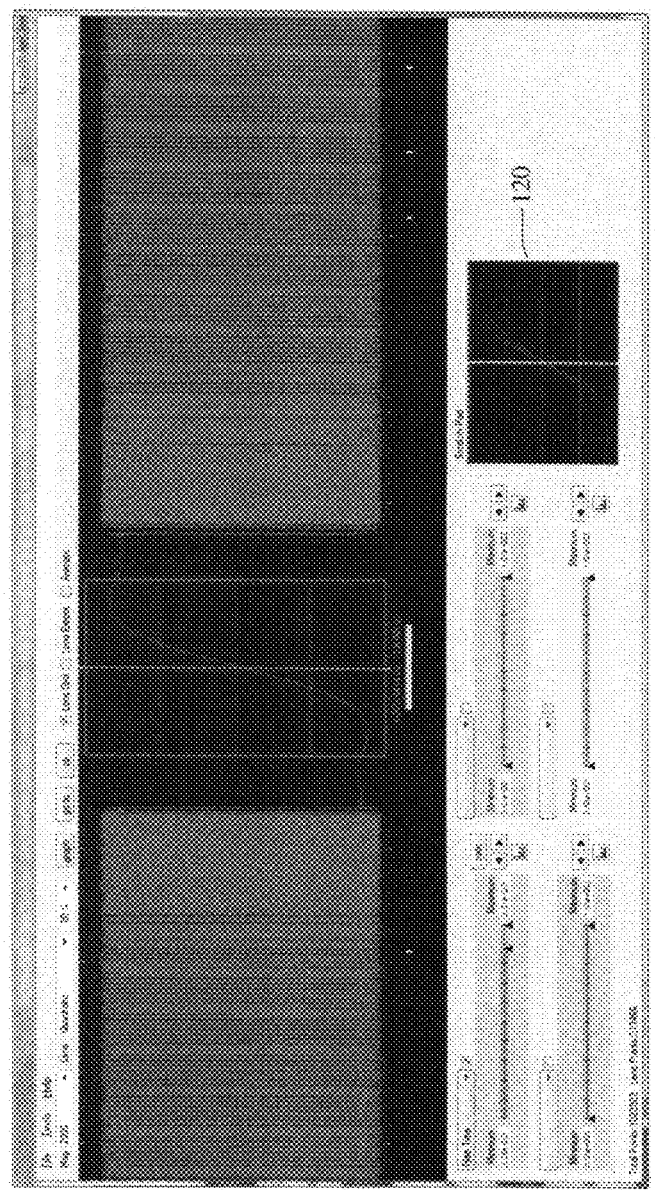
FIG. 28 illustrates overlaying different portions of the dense, time series graph on the scratch pad.

FIG. 27 shows the user interface of the system 100 provided with an optional scratch pad display 120. In this embodiment, in addition to the display of the dense, time series graph 12 on display 10 and the measurement, histogram and other features described above with regard to previous embodiments, user interface 100 provides a "scratch pad" display 120 that is displayed along with, but adjacent (typically below) the display of graph 12, all on display screen 10. Following up with the dataset that was displayed and analyzed in FIGS. 22-24, FIG. 27 shows that the peak identified in FIG. 24 as anomalous can be also displayed in the scratch pad display 120 by pressing a predefined function key on the keyboard (or by actuating some other control feature) to cause the region currently in the fixed magnification grid 16 to be copied to the scratch pad 120, as shown in FIG. 27. If the user moves the cursor 14 to another waveform and again actuates the predefined scratch pad function key or other control actuator, the second waveform (waveform in the magnification grid 16 as a result of moving the cursor) is overlaid on the previous capture in the scratch pad 120, as illustrated in FIG. 28. Another key or series of keystrokes or other control can be configured to remove a single waveform from the scratch pad 120, for sequential removal of waveforms. Still another key or series of keystrokes or other control can be configured to remove a single waveform from scratch pad, for simultaneous removal of all waveforms.

Thus by the scratch pad function in a manner as described above, the user can overlay peaks or other portions of the graph 12 so that the user can visually compare the overlaid waveforms as part of an analysis.

Figure 29:
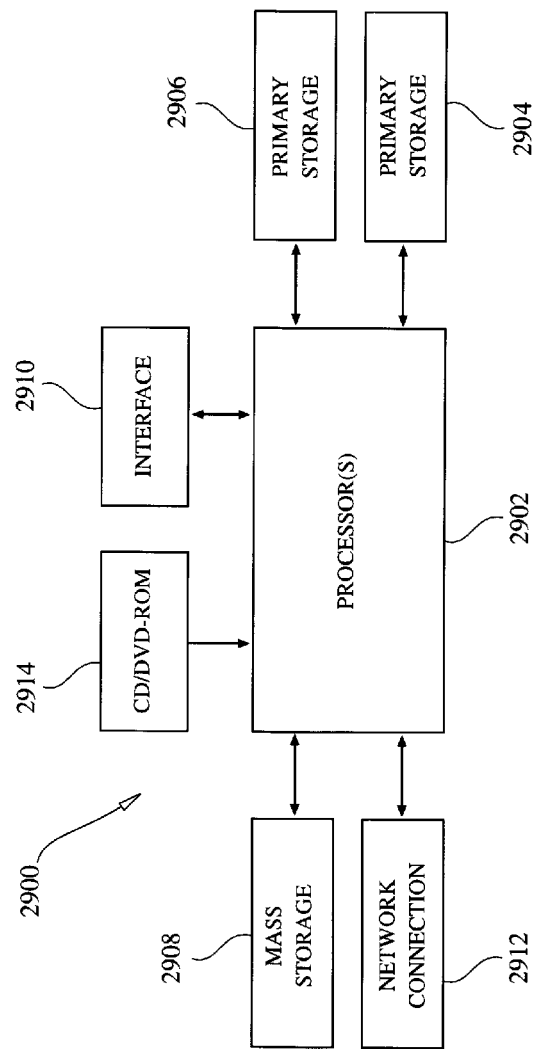
FIG. 29 illustrates a schematic representation of a typical computer system in accordance with an embodiment of the present invention.

FIG. 29 illustrates a typical computer system in accordance with an embodiment of the present invention. The computer system 2900 includes any number of processors 2902 (also referred to as central processing units, or CPUs) that are coupled to storage devices including primary storage 2906 (typically a random access memory, or RAM), primary storage 2904 (typically a read only memory, or ROM). As is well known in the art, primary storage 2904 acts to transfer data and instructions uni-directionally to the CPU and primary storage 2906 is used typically to transfer data and instructions in a bidirectional manner. Both of these primary storage devices may include any suitable computer-readable media such as those described above. A mass storage device 2908 is also coupled bi-directionally to CPU 2902 and provides additional data storage capacity and may include any of the computer-readable media described above. It is noted here that the terms "computer readable media" and "computer readable medium", as used herein, do not include carrier waves or other forms of energy, per se. Mass storage device 2908 may be used to store programs, data and the like and is typically a secondary storage medium such as a hard disk that is slower than primary storage. It will be appreciated that the information retained within the mass storage device 2908, may, in appropriate cases, be incorporated in standard fashion as part of primary storage 2906 as virtual memory. A specific mass storage device such as a CD-ROM or DVD-ROM 2914 may also pass data uni-directionally to the CPU.

CPU 2902 is also coupled to an interface 2910 that includes user interface 100, and which may include one or more input/output devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. CPU 2902 optionally may be coupled to a computer or telecommunications network using a network connection as shown generally at 2912. With such a network connection, it is contemplated that the CPU might receive information from the network, or might output information to the network in the course of performing the above-described method steps. The above-described devices and materials will be familiar to those of skill in the computer hardware and software arts.

The hardware elements described above may implement the instructions of multiple software modules for performing the operations of this invention. For example, instructions for calculating measurements, plotting dense, time series graphs and plotting tracks may be stored on mass storage device 2908 or 2914 and executed on CPU 2908 in conjunction with primary memory 2906.

While the present invention has been described with reference to the specific embodiments thereof, it should be understood by those skilled in the art that various changes may be made and equivalents may be substituted without departing from the scope of the invention. In addition, many modifications may be made to adapt a particular situation, material, composition of matter, process, process step or steps, to the objective, and scope of the present invention. All such modifications are intended to be within the scope of the claims-appended hereto.

I claim:

1. A system for displaying a dense graph and details of a portion of the dense graph on a display of said system, said system comprising:

a processor coupled to memory, an input device and said display and adapted to perform operations comprising:

locally distorting an open region of the dense graph identified by interaction through said input device, said locally distorting comprising expanding a portion of the open region of the dense graph along a first dimension axis of the graph, compressing at least one other portion of the open region of the dense graph adjacent the expanded portion along the first dimension axis, and maintaining a scale of all of the dense graph in a second dimension orthogonal to said first dimension; and causing said display to display said dense graph and said expanded and compressed portions, wherein all data represented by said dense graph displayed on said display prior to said locally distorting is displayed after said locally distorting.

2. The system of claim 1, wherein said system comprises an oscilloscope.

3. The system of claim 1, wherein said operations additionally comprise motif matching additional portions of said dense graph matching at least a selected portion of the expanded portion, wherein said motif matching comprises comparing a portion of said dense graph with a remainder of said dense graph to identify wave forms similar to a wave form formed by said portion.

4. The system of claim 1, wherein said operations additionally comprise calculating measurements relative to said dense graph and displaying track marks adjacent said display of said dense graph along the first dimension axis at locations of said graph from which said measurements were calculated where the data at the locations of said graph meet a predefined condition.

5. The system of claim 4, wherein said locally distorting further comprises locally distorting said track marks that are aligned with the open portion of the dense graph.

6. The system of claim 4, wherein at least two different types of measurements are calculated and a track of said track marks is displayed for each type of measurement, respectively.

7. The system of claim 6, wherein said processor is further adapted for carrying out logical operations on data identified by said track marks.

8. The system of claim 6, wherein said processor is further adapted for calculating measurements of said measurements.

9. The system of claim 4, wherein said operations additionally comprise displaying a histogram of said measurements, filtering the tracks in response to a selection of a value in said histogram, and displaying only tracks corresponding to the selected value of said histogram.

10. The system of claim 1, wherein said processor is further adapted to cause said display to display at least a portion of said expanded portion on a scratch pad display.

11. The system of claim 10, wherein said processor is further adapted to cause said display to overlay multiple portions of said graph on said scratch pad display.

12. The system of claim 1, wherein said system comprises an oscilloscope and said dense graph comprises an oscilloscope trace, said processor configured to calculate measurements relative to said oscilloscope trace, and said system configured to display track marks adjacent said display of said oscilloscope trace on said display, along said first axis of said oscilloscope trace, adjacent locations of said oscilloscope trace where data used to calculate said measurements meet a predefined condition.

13. The system of claim 12, wherein said processor is further adapted to carry out calculations for motif matching additional portions of said oscilloscope trace that are similar to at least a selected portion of the expanded portion, and for causing said display to display said track marks adjacent said additional portions, wherein said motif matching comprises comparing a portion of said dense graph with a remainder of said dense graph to identify wave forms similar to a wave form formed by said portion.

14. A computer-assisted method of analyzing a dense graph, said method comprising:
selecting a first portion of the dense graph via an input device;
performing local distortion of said selected first portion of the dense graph, performing the local distortion comprising expanding a portion of the selected first portion along a time dimension axis of the graph, compressing at least one adjacent portion of the selected first portion adjacent the expanded portion along the time dimension axis, and maintaining a scale of all of the dense graph in a magnitude dimension orthogonal to said time dimension; and
displaying said dense graph and said expanded and compressed portions, wherein all data represented by said dense graph displayed on said display prior to said locally distorting is displayed after said locally distorting.

15. The method of claim 14, further comprising:
real time navigating to select a second portion of said dense graph, using said input device;
performing local distortion of said selected second portion of the dense graph, performing the local distortion comprising expanding a portion of the selected second portion along the time dimension axis of the graph, compressing at least one adjacent portion of the selected second portion adjacent the expanded portion, wherein the first portion is returned to an undistorted state, and the scale of all of the dense graph in the magnitude dimension is maintained undistorted; and
displaying said dense graph and said expanded second portion and the adjacent at least one compressed portion, wherein all data represented by said dense graph displayed on said display prior to said locally distorting is displayed after said locally distorting.

16. The method of claim 14, further comprising:
motif matching said dense graph, wherein said motif matching comprises comparing a portion of said dense graph with a remainder of said dense graph to identify wave forms similar to a wave form formed by said portion; and
displaying track marks adjacent said display of said dense graph along said time dimension axis adjacent locations of said dense graph where wave forms similar to said wave form formed by said portion were identified.

17. The method of claim 16, further comprising:
enabling user selection of said portion, using an input device of a computer configured to carry out said computer-assisted method.

18. The method of claim 14, further comprising:
calculating different types of measurements relative to said dense graph; and
displaying track marks adjacent said display of said dense graph, along said time dimension axis of said dense graph, adjacent locations of said dense graph where data is located which, when used in calculating said measurements, meet a predefined criterion, wherein one of said tracks is displayed for each type of measurement, respectively, to enable comparison of said tracks to identify locations along the first axis where disparities occur.

19. A computer readable storage medium having stored thereon one or more sequences of instructions, executable by a computer, for facilitating computer-assisted analysis of a dense graph, the computer readable storage medium comprising:
interface instructions for providing an interactive user feature for user selection of a portion of the dense graph via an input device;
distorting instructions for locally distorting said selected portion of the dense graph, wherein locally distorting said selected portion comprises expanding a portion of the selected portion of the dense graph along a first dimension axis of the graph, compressing at least one adjacent portion of the selected portion of the dense graph adjacent to the expanded portion, and maintaining a scale of all of the dense graph in a second dimension orthogonal to said first dimension; and
display instructions for generating a display signal representing said dense graph and said expanded and compressed portions, wherein all of said graph represented by said display signal prior to said locally distorting is represented by said display signal after said locally distorting.

20. The computer readable storage medium of claim 19, further comprising:
motif matching instructions for motif matching a remainder of said dense graph not included in the selected portion, wherein said motif matching comprises comparing at least part of the selected portion of said dense graph with said remainder of said dense graph to identify wave forms similar to a wave form formed by said at least part of said selected portion.

21. The computer readable storage medium of claim 20, wherein the display instructions further comprise instructions for displaying track marks adjacent said display of said dense graph along said first dimension axis thereof adjacent locations of said graph where motif matches were identified.

* * * * *